United States Patent
Shealy

(10) Patent No.: US 9,362,887 B2
(45) Date of Patent: Jun. 7, 2016

(54) INTEGRATED CIRCUIT CONFIGURED WITH TWO OR MORE SINGLE CRYSTAL ACOUSTIC RESONATOR DEVICES

(71) Applicant: Akoustis, Inc., Cornelius, NC (US)

(72) Inventor: Jeffrey B. Shealy, Cornelius, NC (US)

(73) Assignee: AKOUSTIS, INC., Huntersville, NC (US)

( * ) Notice: Subject to any disclaimer, the term of this patent is extended or adjusted under 35 U.S.C. 154(b) by 0 days.

(21) Appl. No.: 14/796,939

(22) Filed: Jul. 10, 2015

(65) Prior Publication Data

US 2015/0357993 A1    Dec. 10, 2015

Related U.S. Application Data

(63) Continuation of application No. 14/298,100, filed on Jun. 6, 2014.

(51) Int. Cl.
| | |
|---|---|
| H03H 9/00 | (2006.01) |
| H03H 9/205 | (2006.01) |
| H03H 3/02 | (2006.01) |
| H03H 9/02 | (2006.01) |
| H03H 9/05 | (2006.01) |
| H03H 9/17 | (2006.01) |
| H03H 9/56 | (2006.01) |
| H03H 9/60 | (2006.01) |

(52) U.S. Cl.
CPC ............... *H03H 9/205* (2013.01); *H03H 3/02* (2013.01); *H03H 9/0095* (2013.01); *H03H 9/02015* (2013.01); *H03H 9/02574* (2013.01); *H03H 9/0542* (2013.01); *H03H 9/174* (2013.01); *H03H 9/568* (2013.01); *H03H 9/605* (2013.01); *H03H 9/175* (2013.01)

(58) Field of Classification Search
CPC ....... G01N 29/022; C03B 15/08; H01J 23/15; H04R 17/00
USPC .............. 310/313 R, 313 A–313 D, 320–322; 333/186–193
See application file for complete search history.

(56) References Cited

U.S. PATENT DOCUMENTS

| | | | |
|---|---|---|---|
| 5,231,327 | A | 7/1993 | Ketcham |
| 5,894,647 | A | 4/1999 | Lakin |
| 6,051,907 | A | 4/2000 | Ylilammi |
| 6,114,635 | A | 9/2000 | Lakin et al. |
| 6,262,637 | B1 | 7/2001 | Bradley et al. |
| 6,377,137 | B1 | 4/2002 | Ruby |
| 6,384,697 | B1 | 5/2002 | Ruby |
| 6,472,954 | B1 | 10/2002 | Ruby et al. |
| 6,617,060 | B2 | 9/2003 | Weeks, Jr. et al. |
| 6,812,619 | B1 | 11/2004 | Kaitila et al. |
| 6,841,922 | B2 | 1/2005 | Aigner et al. |
| 6,864,619 | B2 | 3/2005 | Aigner et al. |
| 6,879,224 | B2 | 4/2005 | Frank |
| 6,909,340 | B2 | 6/2005 | Aigner et al. |
| 6,933,807 | B2 | 8/2005 | Marksteiner et al. |

(Continued)

*Primary Examiner* — Thomas Dougherty
(74) *Attorney, Agent, or Firm* — Richard T. Ogawa; Ogawa P.C

(57) ABSTRACT

A configurable single crystal acoustic resonator (SCAR) device integrated circuit. The circuit comprises a plurality of SCAR devices numbered from 1 through N, where N is an integer of 2 and greater. Each of the SCAR device has a thickness of single crystal piezo material formed overlying a surface region of a substrate member. The single crystal piezo material is characterized by a dislocation density of less than $10^{12}$ defects/cm$^2$.

19 Claims, 28 Drawing Sheets

(56) References Cited

U.S. PATENT DOCUMENTS

| | | |
|---|---|---|
| 7,112,860 B2 | 9/2006 | Saxler |
| 7,250,360 B2 | 7/2007 | Shealy et al. |
| 7,268,436 B2 | 9/2007 | Aigner et al. |
| 7,365,619 B2 | 4/2008 | Aigner et al. |
| 7,514,759 B1 | 4/2009 | Mehta et al. |
| 7,875,910 B2 | 1/2011 | Sheppard et al. |
| 7,982,363 B2 | 7/2011 | Chitnis |
| 8,304,271 B2 | 11/2012 | Huang et al. |
| 2003/0107456 A1* | 6/2003 | Nishihara ............... H03H 3/02 333/187 |
| 2007/0205850 A1* | 9/2007 | Jamneala ........... H03H 9/02118 333/187 |
| 2012/0293277 A1* | 11/2012 | Hara .................... H03H 9/0576 333/133 |

* cited by examiner

| Filter Solution | Conventional | Present Example |
|---|---|---|
| Filter type | BAW or FBAR | BAW |
| Filter Peizo Material | AlN, ZnO, PZT | Single Crystal GaN or AlGaN |
| Substrate | Silicon/Sapphire | Silicon |
| Technique | Sputtered | MOCVD |
| Crystal Quality | Amorphous (random) 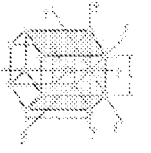 | Single-Crystal (ordered)  |
| Acoustic Coupling ($K^2$) | Poor (6.5%–15%) | Better (>30% projected) |
| Filter Insertion Loss (dB) | -3dB (Lossy) | -1dB is goal (Disruptive) |
| Adjacent channel rejection | good | better |
| Transmitter Impact | 60% Tx Power lost | 20% Tx Power lost |
| Receiver Impact | Degrade Signal Quality | Improved Signal Quality |

FIG. 13

INTEGRATED CIRCUIT CONFIGURED WITH TWO OR MORE SINGLE CRYSTAL ACOUSTIC RESONATOR DEVICES

CROSS-REFERENCES TO RELATED APPLICATIONS

This application is a continuation of U.S. application Ser. No. 14/298,100, filed Jun. 6, 2014, which claims priority to U.S. application No., commonly assigned, and hereby incorporated by reference for all purposes. The present application incorporates by reference, for all purposes, the following concurrently filed patent applications, all commonly owned: Ser. No. 14/298,057 titled "RESONANCE CIRCUIT WITH A SINGLE CRYSTAL CAPACITOR DIELECTRIC MATERIAL", filed Jun. 6, 2014, and Ser. No. 14/298,076 titled "METHOD OF MANUFACTURE FOR SINGLE CRYSTAL CAPACITOR DIELECTRIC FOR A RESONANCE CIRCUIT", filed Jun. 6, 2014.

BACKGROUND OF THE INVENTION

The present invention relates generally to electronic devices. More particularly, the present invention provides techniques related to a single crystal acoustic resonator. Merely by way of example, the invention has been applied to a resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to a single crystal acoustic resonator. Merely by way of example, the invention has been applied to a resonator device for a communication device, mobile device, computing device, among others.

In an example, the present invention provides a single crystal capacitor dielectric material configured on a substrate by a limited area epitaxy. The material is coupled between a pair of electrodes, which are configured from a topside and a backside of a substrate member, in an example. In an example, the single crystal capacitor dielectric material is provided using a metal-organic chemical vapor deposition, a molecular beam epitaxy, an atomic layer deposition, a pulsed laser deposition, a chemical vapor deposition, or a wafer bonding process. In an example, the limited area epitaxy is lifted-off the substrate and transferred to another substrate. In an example, the material is characterized by a defect density of less than 1E+11 defects per square centimeter. In an example, the single crystal capacitor material is selected from at least one of AlN, AlGaN, InN, BN, or other group III nitrides. In an example, the single crystal capacitor material is selected from at least one of a single crystal oxide including a high K dielectric, ZnO, or MgO.

In an example, a single crystal acoustic electronic device is provided. The device has a substrate having a surface region. The device has a first electrode material coupled to a portion of the substrate and a single crystal capacitor dielectric material having a thickness of greater than 0.4 microns and overlying an exposed portion of the surface region and coupled to the first electrode material. In an example, the single crystal capacitor dielectric material is characterized by a dislocation density of less than $10^{12}$ defects/cm$^2$. A second electrode material is overlying the single crystal capacitor dielectric material.

In an example, the present invention provides a configurable single crystal acoustic resonator (SCAR) device integrated circuit. The circuit comprises a plurality of SCAR devices numbered from 1 through N, where N is an integer of 2 and greater. Each of the SCAR device has a thickness of single crystal piezo material formed overlying a surface region of a substrate member. The single crystal piezo material is characterized by a dislocation density of less than $10^{12}$ defects/cm$^2$.

One or more benefits are achieved over pre-existing techniques using the invention. In particular, the invention enables a cost-effective resonator device for communications applications. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 13 is a simplified table illustrating features of a conventional filter compared against the present examples according to examples of the present invention.

DETAILED DESCRIPTION OF THE INVENTION

According to the present invention, techniques generally related to electronic devices are provided. More particularly, the present invention provides techniques related to a single crystal acoustic resonator. Merely by way of example, the invention has been applied to a resonator device for a communication device, mobile device, computing device, among others.

As additional background, the number of bands supported by smartphones is estimated to grow by 7-fold compared to conventional techniques. As a result, more bands mean high selectivity filter performance is becoming a differentiator in the RF front end of smartphones. Unfortunately, conventional techniques have severe limitations.

That is, conventional filter technology is based upon amorphous materials and whose electromechanical coupling efficiency is poor (only 7.5% for non-lead containing materials) leading to nearly half the transmit power dissipated in high selectivity filters. In addition, single crystal acoustic wave devices are expected to deliver improvements in adjacent channel rejection. Since there are twenty (20) or more filters in present smartphone and the filters are inserted between the power amplifier and the antenna solution, then there is an opportunity to improve the RF front end by reducing thermal dissipation, size of power amplifier while enhancing the signal quality of the smartphone receiver and maximize the spectral efficiency within the system.

Utilizing single crystal acoustic wave device (herein after "SAW" device) and filter solutions, one or more of the following benefits may be achieved: (1) large diameter silicon wafers (up to 200 mm) are expected to realize cost-effective high performance solutions, (2) electromechanical coupling efficiency is expected to more than triple with newly engineered strained piezo electric materials, (3) Filter insertion loss is expected to reduce by 1 dB enabling longer battery life, improve thermal management with smaller RF footprint and improving the signal quality and user experience. These and other benefits can be realized by the present device and method as further provided throughout the present specification, and more particularly below.

Figure 1:
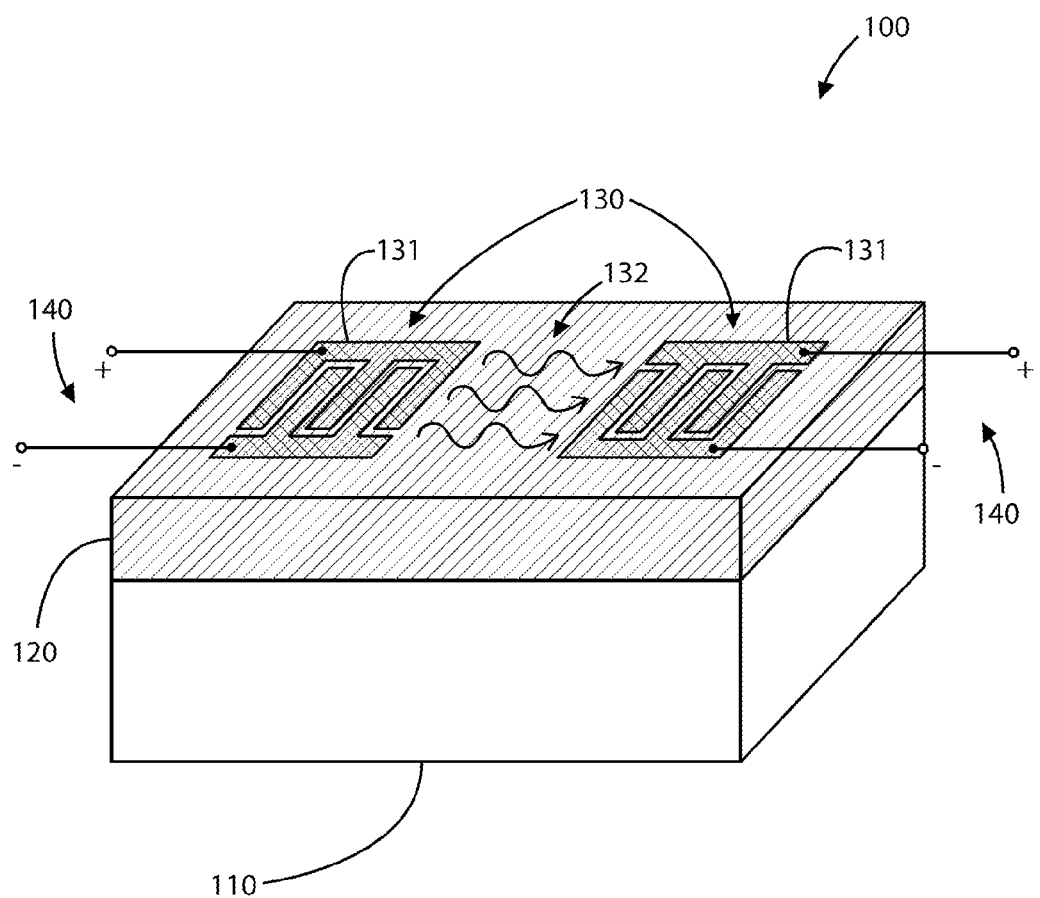
FIG. 1 is a simplified diagram illustrating a surface single crystal acoustic resonator according to an example of the present invention.

FIG. 1 is a simplified diagram illustrating a surface single crystal acoustic resonator according to an example of the present invention. This diagram is merely an example, which should not unduly limit the scope of the claims. The present surface single crystal acoustic resonator device 100 having a crystalline piezo material 120 overlying a substrate 110 is illustrated. As shown, an acoustic wave propagates in a lateral direction from a first spatial region to a second spatial region substantially parallel to a pair of electrical ports 140, which form an inter-digital transducer configuration 130 with a plurality of metal lines 131 that are spatially disposed between the pair of electrical ports 140. In an example, the electrical ports on the left side can be designated for signal input, while the electrical ports on the right side are designated for signal output. In an example, a pair of electrode regions are configured and routed to a vicinity of a plane parallel to a contact region coupled to the second electrode material.

In a SAW device example, surface acoustic waves produce resonant behavior over a narrow frequency band near 880 MHz to 915 MHz frequency band—which is a designated passband for a Europe, Middle East and Africa (EMEA) LTE enabled mobile smartphone. Depending on region of operation for the communication device, there can be variations. For example, in North American transmit bands, the resonator can be designed such that resonant behavior is near the 777 MHz to 787 MHz frequency passband. Other transmit bands, found in other regions, can be much higher in frequency, such as the Asian transmit band in the 2570 MHz to 2620 MHz passband. Further, the examples provided here are for transmit bands. In similar fashion, the passband on the receiver side of the radio front end also require similar performing resonant filters. Of course, there can be variations, modifications, and alternatives.

Other characteristics of surface acoustic wave devices include the fundamental frequency of the SAW device, which is determined by the surface propagation velocity (determined by the crystalline quality of the piezo-electric material selected for the resonator) divided by the wavelength (determined by the fingers in the interdigitated layout in FIG. 1). Measured propagation velocity (also referred to as SAW velocity) in GaN of approximately 5800 m/s has been recorded, while similar values are expected for AlN. Accordingly, higher SAW velocity of such Group III-nitrides enables a resonator to process higher frequency signals for a given device geometry.

Resonators made from Group III-nitrides are desirable as such materials operate at high power (leveraging their high critical electric field), high temperature (low intrinsic carrier concentration from their large bandgap) and high frequency (high saturated electron velocities). Such high power devices (greater than 10 Watts) are utilized in wireless infrastructure and commercial and military radar systems to name a few. Further, stability, survivability and reliability of such devices are critical for field deployment.

Further details of each of the elements provided in the present device can be found throughout the present specification and more particular below.

Figure 2:
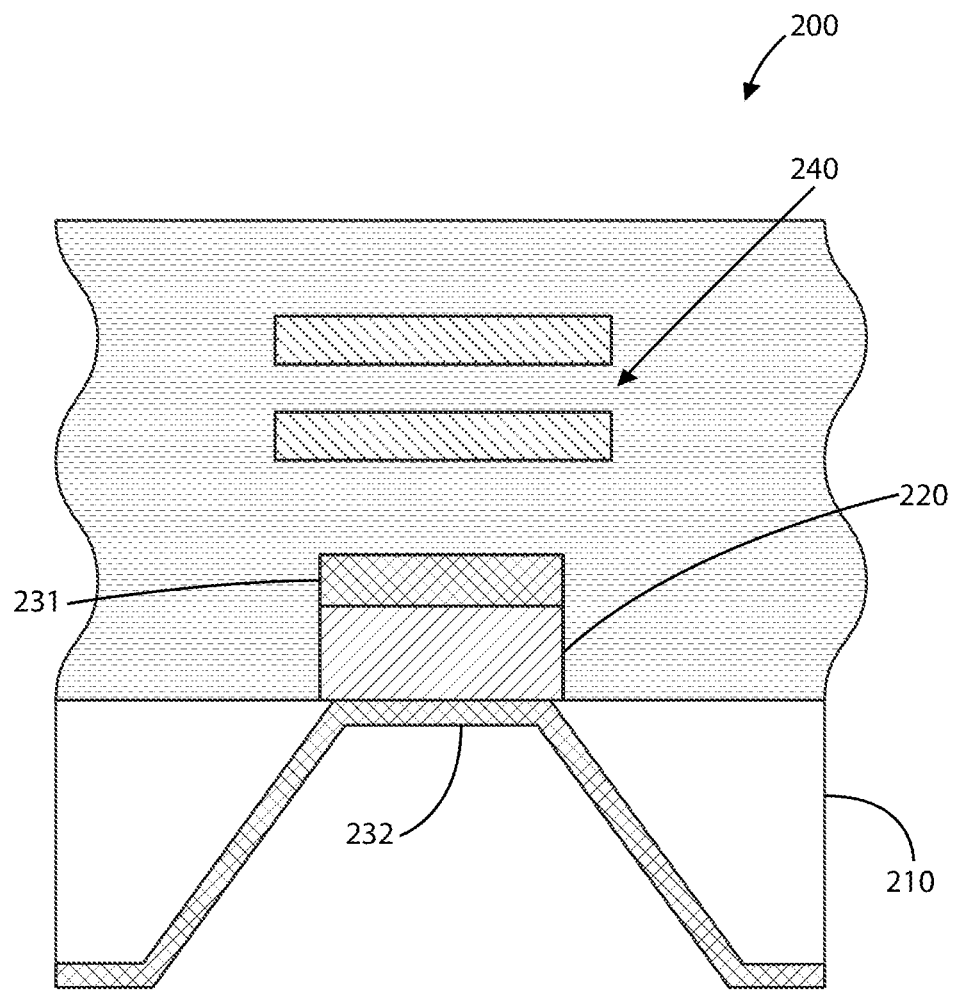
FIG. 2 is a simplified diagram illustrating a bulk single crystal acoustic resonator according to an example of the present invention.

FIG. 2 is a simplified diagram illustrating a bulk single crystal acoustic resonator according to an example of the present invention. This diagram is merely an example, which should not unduly limit the scope of the claims. The present bulk single crystal acoustic resonator device 200 having a crystalline piezo material is illustrated. As shown, an acoustic wave propagates in a vertical direction from a first spatial region to a second spatial region between an upper electrode material 231 and a substrate member 210. As shown, the crystalline piezo material 220 is configured between the upper (231) and lower (232) electrode material. The top electrode material 231 is configured underneath a plurality of optional reflector layers, which are formed overlying the top electrode 231 to form an acoustic reflector region 240.

In a bulk acoustic wave (hereinafter "BAW") device example, acoustic waves produce resonant behavior over a narrow frequency band near 3600 MHz to 3800 MHz frequency band—which is a designated passband for a LTE enabled mobile smartphone. Depending on region of operation for the communication device, there can be variations. For example, in North American transmit bands, the resonator can be designed such that resonant behavior is near the 2000 MHz to 2020 MHz frequency passband. Other transmit bands, found in other regions such as the Asian transmit band in the 2500 MHz to 2570 MHz passband. Further, the examples provided here are for transmit bands. In similar fashion, the passband on the receiver side of the radio front end also require similar performing resonant filters. Of course, there can be variations, modifications, and alternatives.

Other characteristics of single crystal BAW devices include the electromechanical acoustic coupling in the device, which is proportionate to the piezoelectricity constant (influence by the design and strain of the single crystal piezo layer) divided by the acoustic wave velocity (influenced by scattering and reflections in the piezo material). Acoustic wave velocity in GaN of over 5300 m/s has been observed. Accordingly, high acoustic wave velocity of such Group III-nitrides enables a resonator to process higher frequency signals for a given device geometry.

Similar to SAW devices, resonators made from Group III-nitrides are desirable as such materials operate at high power (leveraging their high critical electric field), high temperature (low intrinsic carrier concentration from their large bandgap) and high frequency (high saturated electron velocities). Such high power devices (greater than 10 Watts) are utilized in wireless infrastructure and commercial and military radar systems to name a few. Further, stability, survivability and reliability of such devices are critical for field deployment.

Further details of each of the materials provided in the present device can be found throughout the present specification and more particular below.

In an example, the device has a substrate, which has a surface region. In an example, the substrate can be a thickness of material, a composite, or other structure. In an example, the substrate can be selected from a dielectric material, a conductive material, a semiconductor material, or any combination of these materials. In an example, the substrate can also be a polymer member, or the like. In a preferred example, the substrate is selected from a material provided from silicon, a gallium arsenide, an aluminum oxide, or others, and their combinations.

In an example, the substrate is silicon. The substrate has a surface region, which can be in an off-set or off cut configuration. In an example, the surface region is configured in an off-set angle ranging from 0.5 degree to 1.0 degree. In an example, the substrate is <111> oriented and has high resistivity (greater than $10^3$ ohm-cm). Of course, there can be other variations, modifications, and alternatives.

In an example, the device has a first electrode material coupled to a portion of the substrate and a single crystal capacitor dielectric material having a thickness of greater than 0.4 microns. In an example, the single crystal capacitor dielectric material has a suitable dislocation density. The dislocation density is less than $10^{12}$ defects/cm$^2$, and greater than $10^4$ defects per cm$^2$, and variations thereof. The device has a second electrode material overlying the single crystal capacitor dielectric material. Further details of each of these materials can be found throughout the present specification and more particularly below.

In an example, the single crystal capacitor material is a suitable single crystal material having desirable electrical properties. In an example, the single crystal capacitor material is generally a gallium and nitrogen containing material such as a AlN, AlGaN, or GaN, among InN, InGaN, BN, or other group III nitrides. In an example, the single crystal capacitor material is selected from at least one of a single crystal oxide including a high K dielectric, ZnO, MgO, or alloys of MgZnGaInO. In an example, the high K is characterized by a defect density of less than $10^{12}$ defects/cm$^2$, and greater than $10^4$ defects per cm$^2$. Of course, there can be other variations, modifications, and alternatives.

In an example, the single crystal capacitor dielectric material is characterized by a surface region at least 50 micron by 50 micron, and variations. In an example, the surface region can be 200 micron×200 um or as high as 1000 um×1000 um. Of course, there are variations, modifications, and alternatives.

In an example, the single crystal capacitor dielectric material is configured in a first strain state to compensate to the substrate. That is, the single crystal material is in a compressed or tensile strain state in relation to the overlying substrate material. In an example, the strained state of a GaN when deposited on silicon is tensile strained whereas an AlN layer is compressively strain relative to the silicon substrate.

In a preferred example, the single crystal capacitor dielectric material is deposited overlying an exposed portion of the substrate. In an example, the single crystal capacitor dielectric is lattice mismatched to the crystalline structure of the substrate, and may be strain compensated using a compressively strain piezo nucleation layer such as AlN or SiN.

In an example, the device has the first electrode material is configured via a backside of the substrate. In an example, the first electrode material is configured via a backside of the substrate. The configuration comprises a via structure configured within a thickness of the substrate.

In an example, the electrode materials can be made of a suitable material or materials. In an example, each of the first electrode material and the second electrode material is selected from a refractory metal or other precious metals. In an example, each of the first electrode material and the second electrode material is selected from one of tantalum, molybdenum, platinum, titanium, gold, aluminum tungsten, or platinum, combinations thereof, or the like.

In an example, the first electrode material and the single crystal capacitor dielectric material comprises a first interface region substantially free from an oxide bearing material. In an example, the first electrode material and the single crystal capacitor dielectric material comprises a second interface region substantially free from an oxide bearing material. In an example, the device can include a first contact coupled to the first electrode material and a second contact coupled to the second electrode material such that each of the first contact and the second contact are configured in a co-planar arrangement.

In an example, the device has a reflector region configured to the first electrode material. In an example, the device also has a reflector region configured to the second electrode material. The reflector region is made of alternating low impedance (e.g. dielectric) and high-impedance (e.g. metal) reflector layers, where each layer is targeted at one quarter-wave in thickness, although there can be variations.

In an example, the device has a nucleation material provided between the single crystal capacitor dielectric material and the first electrode material. The nucleation material is typically AlN or SiN.

In an example, the device has a capping material provided between the single crystal capacitor dielectric material and the second electrode material. In an example, the capping material is GaN.

In an example, the single crystal capacitor dielectric material preferably has other properties. That is, the single crystal capacitor dielectric material is characterized by a FWHM of less than one degree.

In an example, the single crystal capacitor dielectric is configured to propagate a longitudinal signal at an acoustic velocity of 5000 meters/second and greater. In other embodiments where strain is engineered, the signal can be over 6000 m/s and below 12,000 m/s. Of course, there can be variations, modifications, and alternatives.

The device also has desirable resonance behavior when tested using a two-port network analyzer. The resonance behavior is characterized by two resonant frequencies (called series and parallel)—whereby one exhibits an electrical impedance of infinity and the other exhibits an impedance of zero. In between such frequencies, the device behaves inductively. In an example, the device has s-parameter derived from a two-port analysis, which can be converted to impedance. From s11 parameter, the real and imaginary impedance of the device can be extracted. From s21, the transmission gain of the resonator can be calculated. Using the parallel resonance frequency along the known piezo layer thickness, the acoustic velocity can be calculated for the device.

Figure 3:
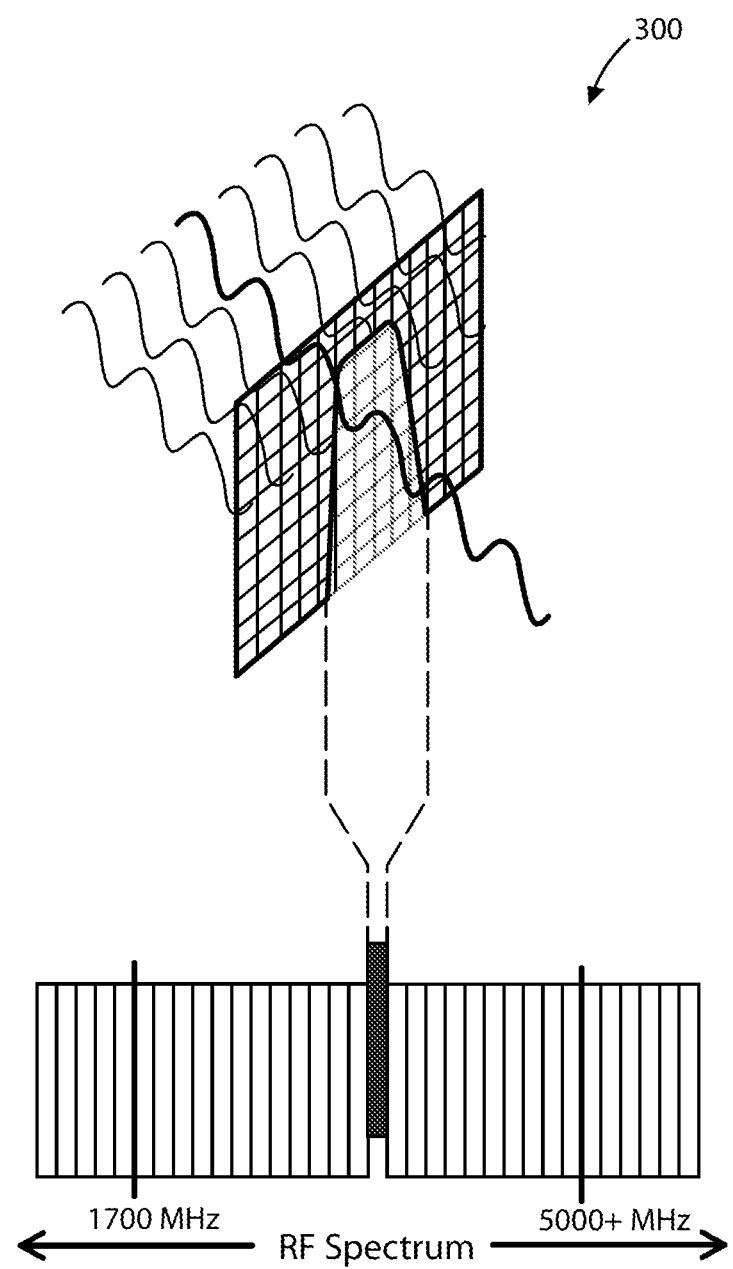
FIG. 3 is a simplified diagram illustrating a feature of a bulk single crystal acoustic resonator according to an example of the present invention.

FIG. 3 is a simplified diagram illustrating a feature of a bulk single crystal acoustic resonator according to an example of the present invention. This diagram is merely an example, which should not unduly limit the scope of the claims. As shown, diagram 300 shows the present invention applied as a band pass filter for RF signals. A specific frequency range is allowed through the filter, as depicted by the darkened block elevated from the RF spectrum underneath the wavelength illustration. This block is matched to the signal allowed through the filter in the illustration above. Single crystal devices can offer better acoustic quality versus BAW devices due to lower filter loss and relieving the specification requirements on the power amplifier. These can result benefits for devices utilizing the present invention such as extended battery, efficient spectrum use, uninterrupted caller experience, and others.

Figure 4:
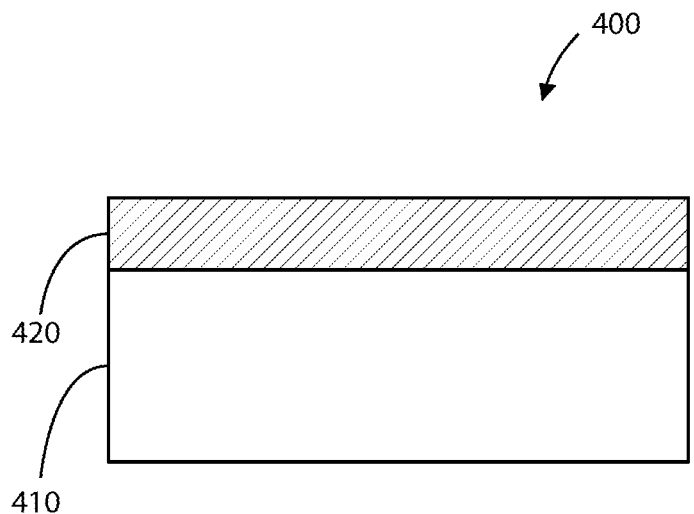
FIG. 4 is a simplified diagram illustrating a piezo structure according to an example of the present invention.

FIG. 4 is a simplified diagram illustrating a piezo structure according to an example of the present invention. This diagram is merely an example, which should not unduly limit the scope of the claims. In an example, the structure 400 is configured on a bulk substrate member 410, including a surface region. In an example, the single crystal piezo material epitaxial 420 is formed using a growth process. The growth process can include chemical vapor deposition, molecular beam epitaxial growth, or other techniques overlying the surface of the substrate. In an example, the single crystal piezo material can include single crystal gallium nitride (GaN) material, single crystal Al(x)Ga(1−x)N where 0<x<1.0 (x="Al mole fraction") material, single crystal aluminum nitride (AlN) material, or any of the aforementioned in combination with each other. Of course, there can also be modifications, alternatives, and variations. Further details of the substrate can be found throughout the present specification, and more particularly below.

Figure 5:
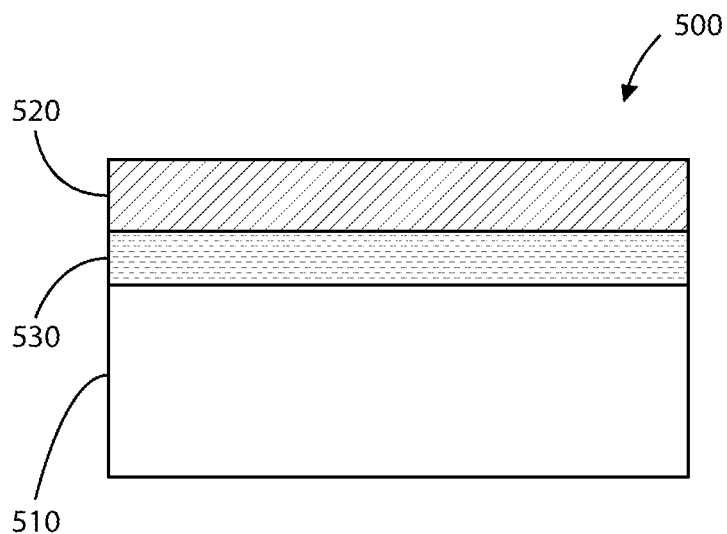
FIG. 5 is a simplified diagram illustrating a piezo structure according to an alternative example of the present invention.

FIG. 5 is a simplified diagram illustrating a piezo structure according to an alternative example of the present invention. This diagram is merely an example, which should not unduly limit the scope of the claims. In an example, the structure 500 is configured overlying a nucleation region 530, which is overlying a surface of the substrate 510. In an example, the nucleation region 530 is a layer or can be multiple layers. The nucleation region is made using a piezo-electric material in order to enable acoustic coupling in a resonator circuit. In an example, the nucleation region is a thin piezo-electric nucleation layer, which may range from about 0 to 100 nm in thickness, may be used to initiate growth of single crystal piezo material 520 overlying the surface of the substrate. In an example, the nucleation region can be made using a thin SiN or AlN material, but can include variations. In an example, the single crystal piezo material has a thickness that can range from 0.2 um to 20 um, although there can be variations. In an example, the piezo material that has a thickness of about 2 um is typical for 2 GHz acoustic resonator device. Further details of the substrate can be found throughout the present specification, and more particularly below.

Figure 6:
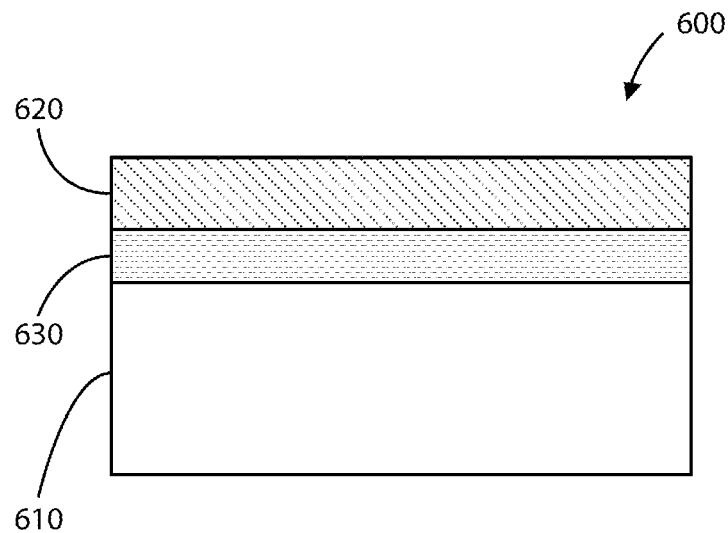
FIG. 6 is a simplified diagram illustrating a piezo structure according to an alternative example of the present invention.

FIG. 6 is a simplified diagram illustrating a piezo structure according to an alternative example of the present invention. This diagram is merely an example, which should not unduly limit the scope of the claims. In an example, the structure 600 is configured using a GaN piezo material 620. In an example, each of the regions are single crystal or substantially single crystal. In an example, the structure is provided using a thin AlN or SiN piezo nucleation region 630, which can be a layer or layers. In an example, the region is unintentional doped (UID) and is provided to strain compensate GaN on the surface region of the substrate 610. In an example, the nucleation region has an overlying GaN single crystal piezo region (having Nd—Na: between $10^{14}$/cm3 and $10^{18}$/cm3), and a thickness ranging between 1.0 um and 10 um, although there can be variations. Further details of the substrate can be found throughout the present specification, and more particularly below.

Figure 7:
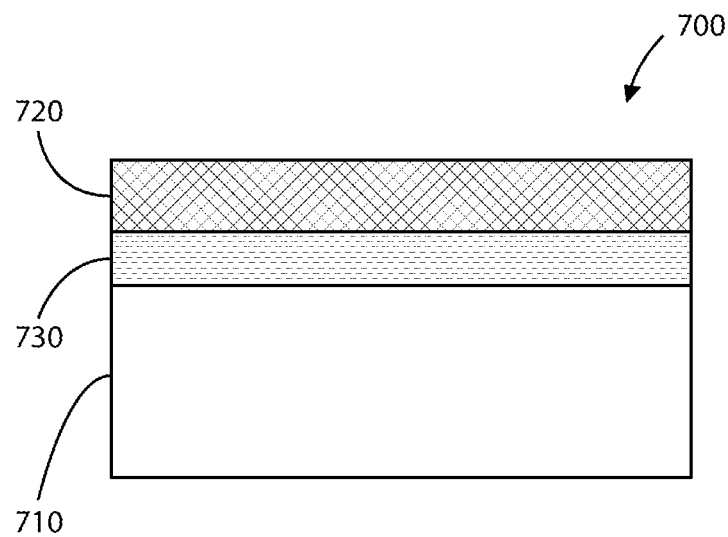
FIG. 7 is a simplified diagram illustrating a piezo structure according to an alternative example of the present invention.

FIG. 7 is a simplified diagram illustrating a piezo structure according to an alternative example of the present invention. This diagram is merely an example, which should not unduly limit the scope of the claims. As shown, the structure 700 is configured using an AlN piezo material 720. Each of the regions is single-crystal or substantially single crystal. In an example, the structure is provided using a thin AlN or SiN piezo nucleation region 730, which can be a layer or layers. In an example, the region is unintentional doped (UID) and is provided to strain compensate AlN on the surface region of the substrate 710. In an example, the nucleation region has an overlying AlN single crystal piezo region (having Nd—Na: between $10^{14}$/cm3 and $10^{18}$/cm3), and a thickness ranging between 1.0 um and 10 um, although there can be variations. Further details of the substrate can be found throughout the present specification, and more particularly below.

Figure 8:
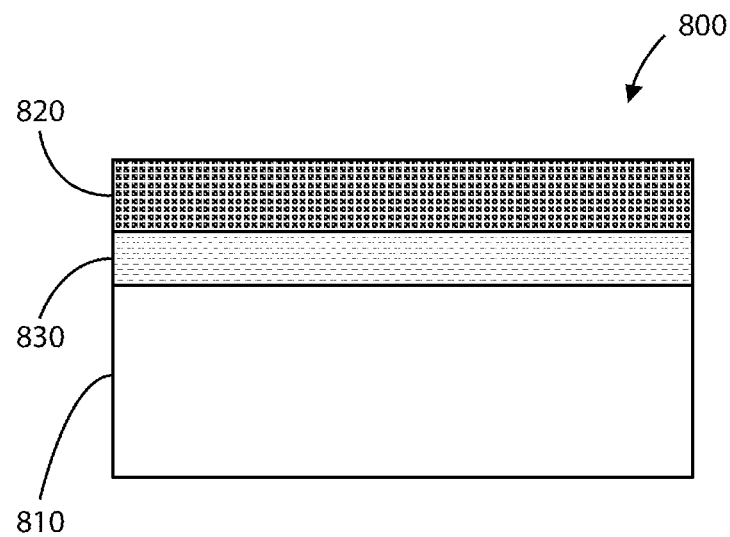
FIG. 8 is a simplified diagram illustrating a piezo structure according to an alternative example of the present invention.

FIG. 8 is a simplified diagram illustrating a piezo structure according to an alternative example of the present invention. This diagram is merely an example, which should not unduly limit the scope of the claims. As shown, the structure 800 is configured using an AlGaN piezo material 820. Each of the regions is single-crystal or substantially single crystal. In an example, the structure is provided using a thin AlN or SiN piezo nucleation region 830, which can be a layer or layers. In an example, the region is unintentional doped (UID) and is provided to strain compensate AlN on the surface region of the substrate 810. In an example, the AlGaN single crystal piezo layer where Al(x)Ga(1−x)N has Al mole composition 0<x<1.0, (Nd—Na: between $10^{14}$/cm3 and $10^{18}$/cm3), a thickness ranging between 1 um and 10 um, among other features. Further details of the substrate can be found throughout the present specification, and more particularly below.

Figure 9:
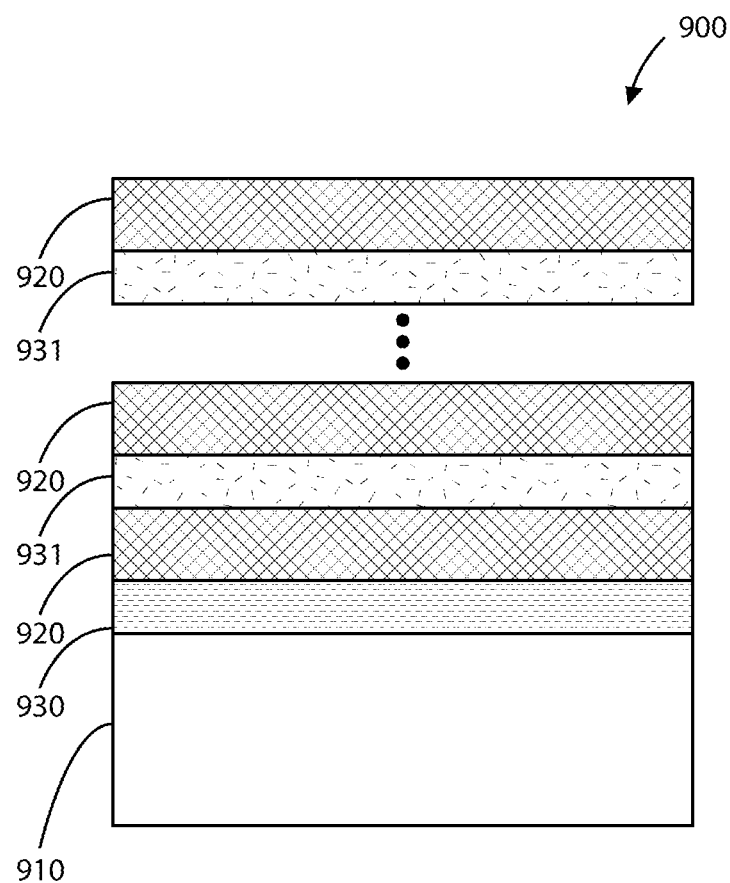
FIG. 9 is a simplified diagram illustrating a piezo structure according to an alternative example of the present invention.

FIG. 9 is a simplified diagram illustrating a piezo structure according to an alternative example of the present invention. This diagram is merely an example, which should not unduly limit the scope of the claims. The structure 900 is configured using an AlN/AlGaN piezo material 920. Each of the regions is single-crystal or substantially single crystal. In an example, the structure is provided using a thin AlN or SiN piezo nucleation region 930, which can be a layer or layers. In an example, the region is unintentional doped (UID) and is provided to strain compensate AlN on the surface region of the substrate 910. In an example, one or more alternating stacks are formed overlying the nucleation region. In an example, the stack includes AlGaN/AlN single crystal piezo layer where Al(x)Ga(1−x)N has Al mole composition 0<x<1.0; (Nd—Na: between 1014/cm3 and 1018/cm3), a thickness ranging between 1.0 um and 10 um; a AlN (1 nm<thickness<30 nm) serves to strain compensate lattice and allow thicker AlGaN piezo layer. In an example, the final single crystal piezo layer is AlGaN. In an example, the structure has a total stack thickness of at least 1 um and less than 10 um, among others. Further details of the substrate can be found throughout the present specification, and more particularly below.

Figure 10:
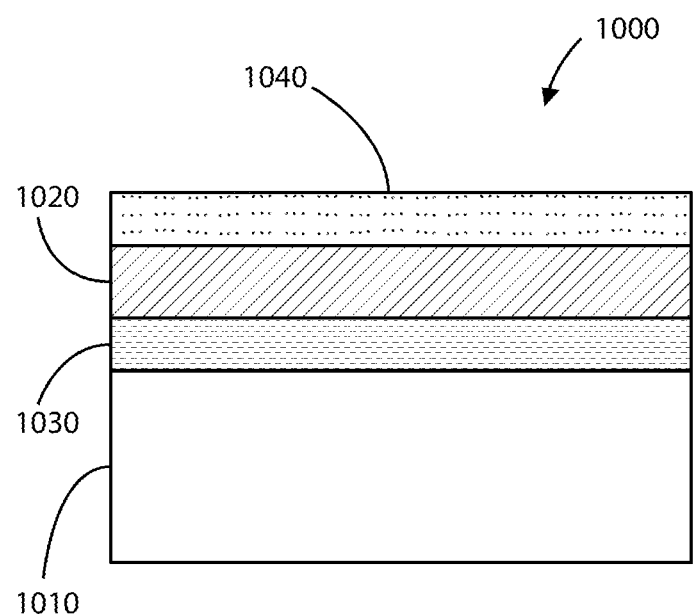
FIG. 10 is a simplified diagram illustrating a piezo structure according to an alternative example of the present invention.

FIG. 10 is a simplified diagram illustrating a piezo structure according to an alternative example of the present invention. This diagram is merely an example, which should not unduly limit the scope of the claims. As shown, the structure 1000 has an optional GaN piezo-electric cap layer or layers 1040. In an example, the cap layer 1040 or region can be configured on any of the aforementioned examples, among others. In an example, the cap region can include at least one or more benefits. Such benefits include improved electro-acoustic coupling from topside metal (electrode 1) into piezo material, reduced, surface oxidation, improved manufacturing, among others. In an example, the GaN cap region has a thickness ranging between 1 nm-10 nm, and has Nd—Na: between $10^{14}$/cm3 and $10^{18}$/cm3, although there can be variations. Further details of the substrate can be found throughout the present specification, and more particularly below.

Figure 11:
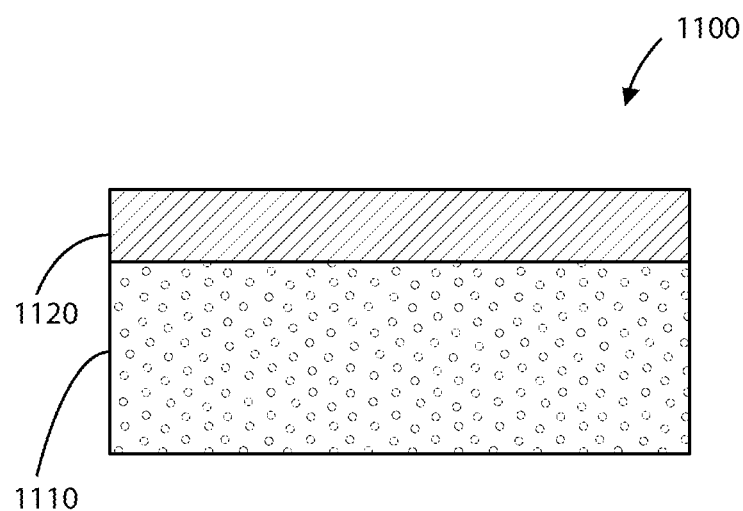
FIG. 11 is a simplified diagram of a substrate member according to an example of the present invention.

FIG. 11 is a simplified diagram of a substrate member according to an example of the present invention. This diagram is merely an example, which should not unduly limit the scope of the claims. In an example, the single crystal acoustic resonator material 1120 can be a single crystal piezo material epitaxial grown (using CVD or MBE technique) on a substrate 1110. The substrate 1110 can be a bulk substrate, a composite, or other member. The bulk substrate 1110 is preferably gallium nitride (GaN), silicon carbide (SiC), silicon (Si), sapphire (Al2O3), aluminum nitride (AlN), combinations thereof, and the like.

Figure 12:
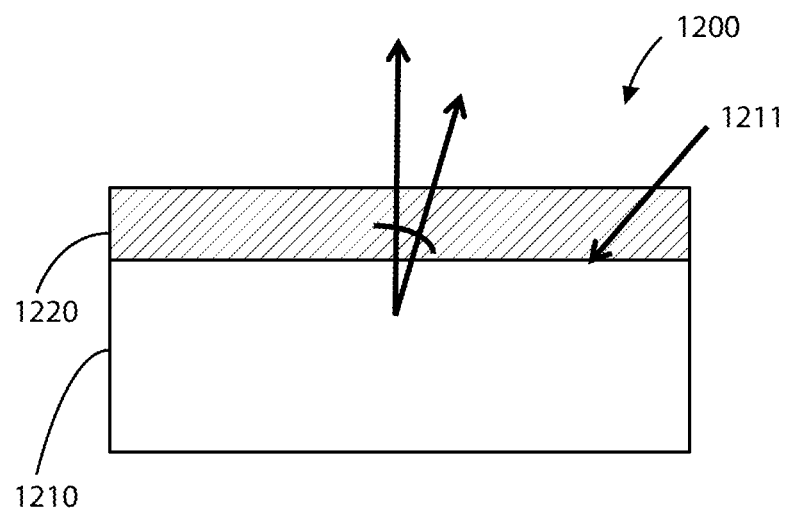
FIG. 12 is a simplified diagram of a substrate member according to an example of the present invention.

FIG. 12 is a simplified diagram of a substrate member according to an example of the present invention. This diagram is merely an example, which should not unduly limit the scope of the claims. In an example, the single crystal acoustic resonator material 1220 can be a single crystal piezo material epitaxial grown (using CVD or MBE technique) on a substrate 1210. The substrate 1210 can be a bulk substrate, a composite, or other member. The bulk substrate 1210 is preferably gallium nitride (GaN), silicon carbide (SiC), silicon (Si), sapphire (Al2O3), aluminum nitride (AlN), combinations thereof, and the like. In an example, the surface region of the substrate is bare and exposed crystalline material.

FIG. 13 is a simplified table illustrating features of a conventional filter compared against the present examples according to examples of the present invention. As shown, the specifications of the "Present Example" versus a "Conventional" embodiment are shown with respect to the criteria under "Filter Solution".

In an example, the GaN, SiC and Al2O3 orientation is c-axis in order to improve or even maximize a polarization field in the piezo-electric material. In an example, the silicon substrate orientation is <111> orientation for same or similar reason. In an example, the substrate can be off-cut or offset. While c-axis or <111> is nominal orientation, an offcut angle between +/−1.5 degrees may be selected for one or more of the following reasons: (1) controllability of process; (2) maximization of K2 of acoustic resonator, and other reasons. In an example, the substrate is grown on a face, such as a growth face. A Ga-face is preferred growth surface (due to more mature process). In an example, the substrate has a substrate resistivity that is greater than 104 ohm-cm, although there can be variations. In an example, the substrate thickness ranges 100 um to 1 mm at the time of growth of single crystal piezo deposition material. Of course, there can be variations, modifications, and alternatives.

As used herein, the terms "first" "second" "third" and "nth" shall be interpreted under ordinary meaning. Such terms, alone or together, do not necessarily imply order, unless understood that way by one of ordinary skill in the art. Additionally, the terms "top" and "bottom" may not have a meaning in reference to a direction of gravity, while should be interpreted under ordinary meaning. These terms shall not unduly limit the scope of the claims herein.

As used herein, the term substrate is associated with Group III-nitride based materials including GaN, InGaN, AlGaN, or other Group III containing alloys or compositions that are used as starting materials, or AlN or the like. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero.).

As shown, the present device can be enclosed in a suitable package. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions, combinations, and the like.

In an example, the present disclosure provides a step-by-step fabrication of a single-crystal acoustic resonator (SCAR) device. Additionally, the disclosure provides fabrication processes to manufacture two or more resonators together to provide a SCAR filter, among other devices. In an example, the present processes can be implemented using conventional high volume wafer fabrication facilities for efficient operations, and competitive costs. Of course, there can be other variations, modifications, and alternatives.

FIGS. 14-22 illustrate a manufacturing method for a single crystal acoustic resonator device in an example of the present invention. These illustrations are merely examples, and should not unduly limit the scope of the claims herein.

Referring to the Figures, an example of a manufacturing process can be briefly described below:
1. Start;
2. Provide a substrate member, e.g., 150 mm or 200 mm diameter material, having a surface region;
3. Treat the surface region;
4. Form an epitaxial material comprising single crystal piezo material overlying the surface region to a desired thickness;
5. Pattern the epitaxial material using a masking and etching process to form a trench region by causing formation of an exposed portion of the surface region through a pattern provided in the epitaxial material;
6. Form topside landing pad metal, which may include a stack that has a metal layer that reacts slowly with etchants in a backside substrate etching process, as defined below;
7. Form topside electrode members, including a first electrode member overlying a portion of the epitaxial material, and a second electrode member overlying the topside landing pad metal;
8. Mask and remove (via etching) a portion of the substrate from the backside to form a first trench region exposing a backside of the epitaxial material overlying the first electrode member, and a second trench region exposing a backside of the landing pad metal;
9. Form backside resonator metal material for the second electrode overlying the exposed portion of the epitaxial material (or piezo membrane) to form a connection from the epitaxial material to the backside of the landing pad metal coupled to the second electrode member overlying the topside landing pad metal;
10. Form resonator active area using a masking and etching process, while electrically and spatially isolating the first electrode member from the second electrode member on the top side, while also fine tuning the resonance capacitor;
11. Form overlying thickness of protecting dielectric material (e.g., SiO2, SiN) overlying an upper surface region on topside surface; and
12. Perform other steps, as desired.

The aforementioned steps are provided for the formation of a resonator device using a single crystal capacitor dielectric. As shown, a pair of electrode members is configured to provide for contact from one side of the device. One of the electrode members uses a backside contact, which is coupled to a metal stack layer to configure the pair of electrodes. Of course, depending upon the embodiment, steps or a step can be added, removed, combined, reordered, or replaced, or has other variations, alternatives, and modifications. Further details of the present manufacturing process can be found throughout the present specification, and more particularly below.

Figure 14:
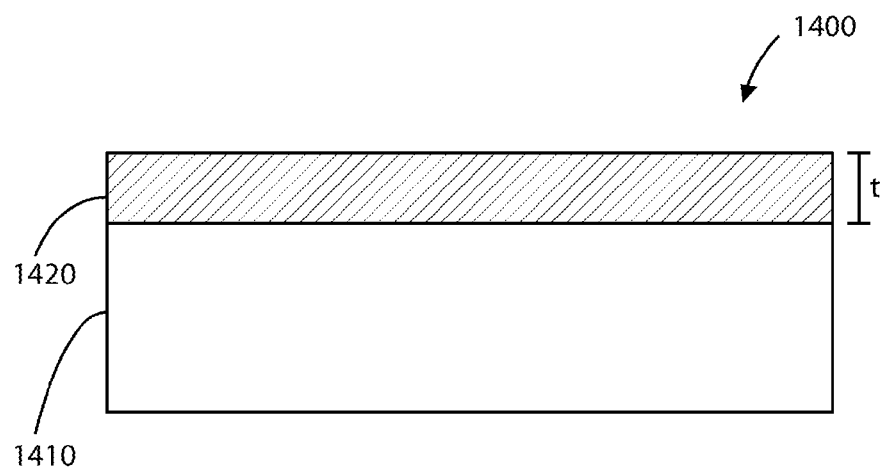
FIGS. 14-22 illustrate a manufacturing method for a single crystal acoustic resonator device in an example of the present invention.

As shown by device 1400 in FIG. 14, the method begins by providing a substrate member 1410. The substrate member has a surface region. In an example, the substrate member thickness (t) is 400 um, which can have a diameter of 150 mm or 200 mm diameter material, although there can be variations from 50 mm to 300 mm.

In an example, the surface region of the substrate member is treated. The treatment often includes cleaning and/or conditioning. In an example, the treatment occurs in an MOCVD or LPCVD reactor with ammonia gas flowing at high temperature (e.g. in the range from 940° C. to 1100° C.) at a pressure ranging from one-tenth of an atmosphere to one atmosphere. Depending upon the embodiment, other treatment processes can also be used.

In an example, the method includes formation of an epitaxial material comprising single crystal piezo material 1420 overlying the surface region to a desired thickness, as shown. Using a configuration of Trimethylgallium (TMG), Trimethylaluminium (TMA), ammonia ($NH_3$) and hydrogen ($H_2$) gases, the epitaxial material is grown under high temperature in the range of 940° C. to 1100° C. in an atmospheric controlled environment using a MOCVD or LPCVD growth apparatus to a thickness ranging from 0.4 um to 7.0 um, depending on target resonance frequency of the capacitor device. The material also has a defect density of $10^4$ to $10^{12}$ per $cm^2$, although there can be variations.

Figure 15:
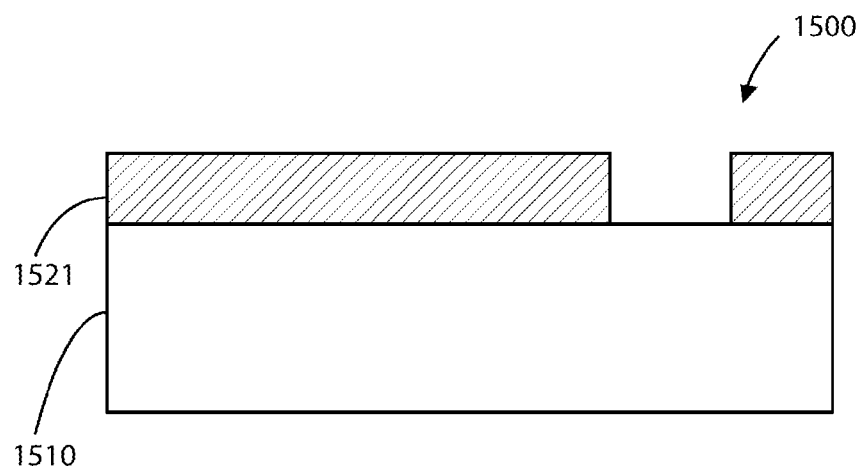
Figure 16:
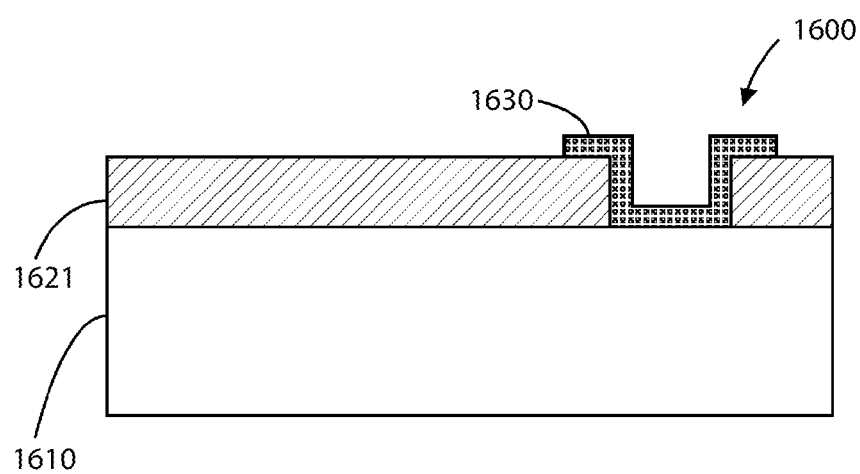

In an example, the epitaxial material 1521 is patterned (FIG. 15). Patterning involves a masking and etching process. The mask is often 1-3 um of photoresist. Etching uses chlorine-based chemistries (gases may include $BCl_3$, $Cl_2$, and/or argon) in an RIE or ICP etch tool, under controlled temperature and pressure conditions to adjust the etch rate and sidewall profile. The patterning forms a trench region (or via structure) by causing formation of an exposed portion of the surface region through a pattern provided in the epitaxial material. Here in device 1500, the epitaxial material 1521 is formed overlying the substrate member 1510.

In an example, the method forms a topside landing pad metal 1630 (FIG. 16), which may include a stack that has a metal layer that reacts slowly with etchants in a backside substrate etching process, as defined below. In an example, the metal is a refractory metal (such as tantalum, molybdenum, tungsten) or other metal (such as gold, aluminum, titanium or platinum). The metal is used subsequently as a stop region for a backside etch process, as noted. Here in device 1600, the topside landing pad metal 1630 is formed overlying the epitaxial material 1621 and the substrate member 1610.

Figure 17:
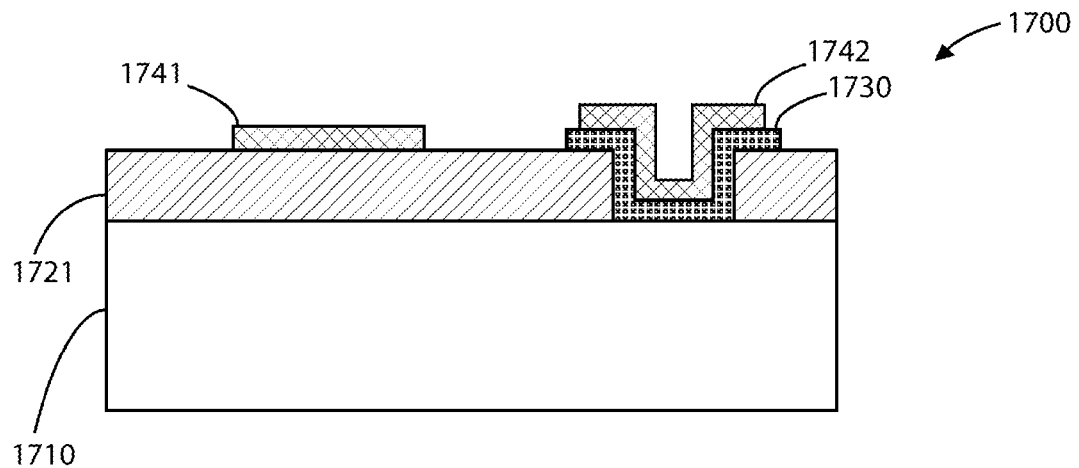
Figure 18:
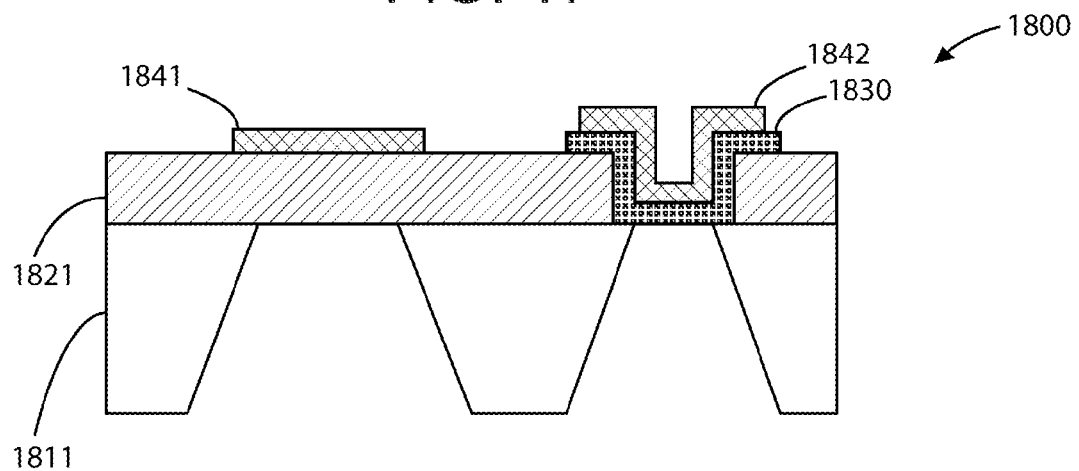
Figure 19:
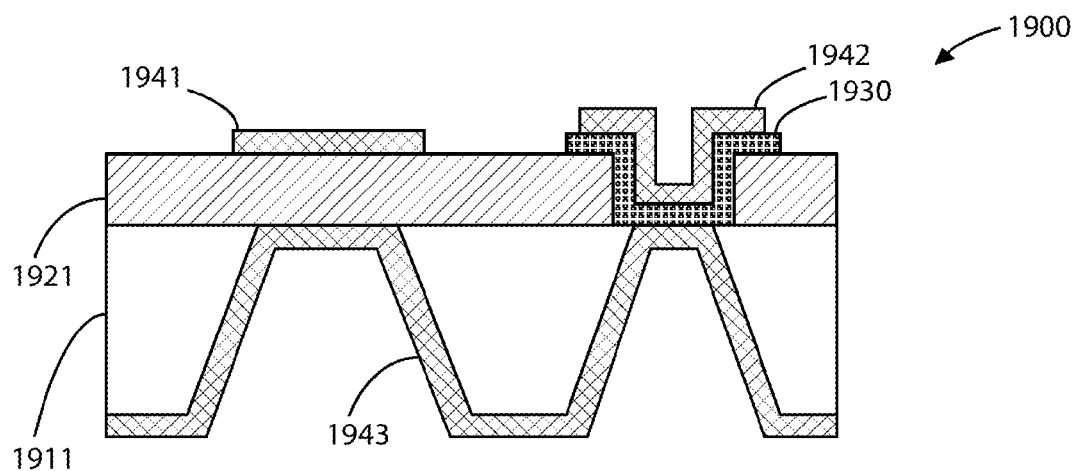

In an example, the method forms a topside metal structure (FIG. 17). The structure has topside electrode members, including a first electrode member 1741 overlying a portion of the epitaxial material 1721, and a second electrode member 1742 overlying the topside landing pad metal 1730, as shown. The metal structure is made using a refractory metal (such as tantalum, molybdenum, tungsten), and has a thickness of 300 nm, chosen to define the resonant frequency of the capacitor device. Here in device 1700, these structures overlie the substrate member 1710.

In an example, the method performs backside processing (FIG. 18), by flipping the substrate top-side down. In an example, the method includes a patterning process of the backside of the substrate. The process uses a mask and removal process via etching a portion of the substrate 1811 from the backside to form a first trench region exposing a backside of the epitaxial material overlying the first electrode member, and a second trench region exposing a backside of the landing pad metal. In an example, etching is performed using chlorine-based gas in either an RIE or ICP reactor with temperature and pressure defined to control etch rate, selectivity and sidewall slope. Here in device 1800, the epitaxial material 1821, the topside landing pad metal 1830, the first electrode member 1841, and the second electrode member 1842 are configured overlying the substrate 1811 as described before.

Next, the method includes formation of a backside resonator metal material 1943

(FIG. 19) along the first and second trench regions of the substrate 1911 for the second electrode overlying the exposed portion of the epitaxial material 1921 (or piezo membrane) to form a connection from the epitaxial material 1921 to the backside of the landing pad metal 1930 coupled to the second electrode member 1942 overlying the topside landing pad metal 1930.

As shown in device 1900, the piezo membrane 1921 is sandwiched between the pair of electrodes 1941 and 1943, which are configured from the top-side and backside of the substrate member 1911. The member is <111> oriented silicon substrate with a resistivity of greater than 10 ohm-cm.

Figure 20:
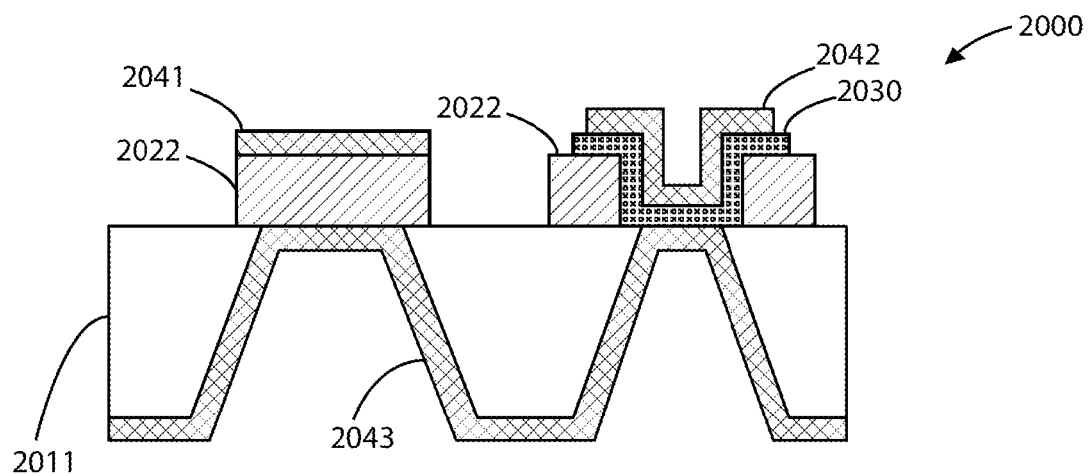

In an example, the method forms or patterns the resonator active area 2022 using a masking and etching process (FIG. 20). The end objective is to electrically and spatially isolate the first electrode member 2041 from the second electrode member 2042 on the top side, while also fine tuning the resonance capacitor. In an example, the resonator active area is 200 um by 200 um. The patterning uses chlorine-based RIE or ICP etching technique. Here in device 2000, the resonator active area 2022, the topside landing pad metal 2030, the first electrode member 2041, and the second electrode member 2042 are configured overlying the substrate 2011 as described before. The second electrode or backside resonator metal material 2043 is configured underlying the substrate 2011.

Figure 21:
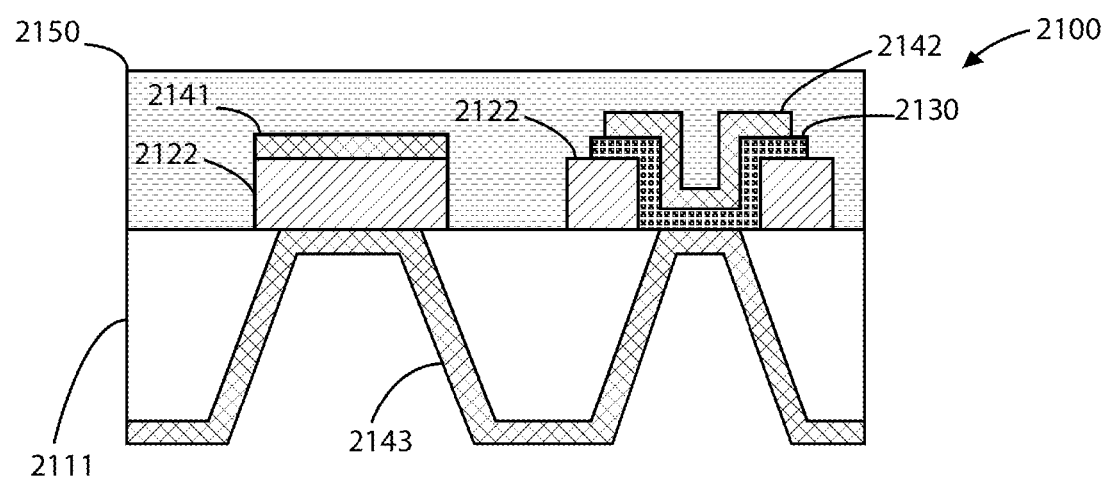

The method forms a thickness of protecting material 2150 (FIG. 21). In an example, the method forms a combination of silicon dioxide, which forms a conforming structure, and an overlying silicon nitride capping material. The silicon dioxide and silicon nitride materials are formed using a combination of silane, nitrogen and oxygen sources and deposited using a PECVD chamber. Here in device 2100, the resonator active area 2022, the topside landing pad metal 2130, the first electrode member 2141, and the second electrode member 2142 are configured overlying the substrate 2111 as described before. The second electrode or backside resonator metal material 2143 is configured underlying the substrate 2111.

Figure 22:
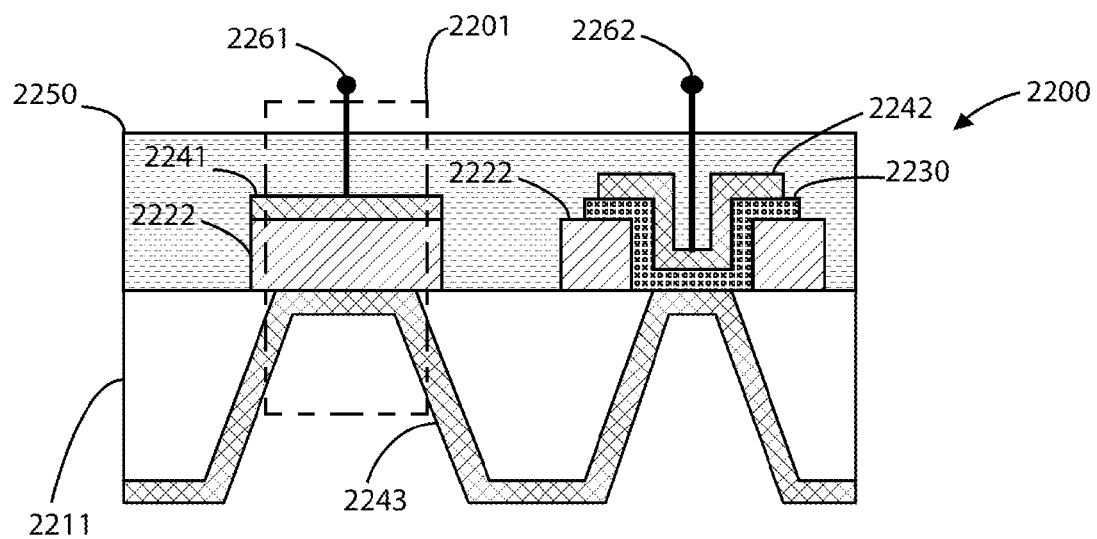

The method forms a first and second electrode (2261, 2262) that are electrically coupled to the first top electrode 2241 and second top electrode 2242, respectively (FIG. 22). The intrinsic device is marked as 2201. In an example, the method also may include other steps or other materials, as desirable. Here in device 2200, the resonator active area 2222, the topside landing pad metal 2230, the first electrode member 2241, and the second electrode member 2242 are configured overlying the substrate 2211 as described before. The protecting material 2250 overlies the previously mentioned elements on the substrate 2211. The second electrode or backside resonator metal material 2243 is configured underlying the substrate 2211.

In an example, the present method can also include one or more of these processes for formation of the upper electrode structures, passivation material, and backside processing. In an example, the present substrate including overlying structures can include a surface clean using HCl:H2O (1:1) for a predetermined amount of time, followed by rinse and load into sputtering tool.

In the sputtering tool to form the electrode metallization, the method includes a molybdenum (Mo) metal (3000 Å) blanket deposition using sputtering technique on an exposed top side of the single crystal piezo material. In an example, if desired, a thin titanium adhesion metal (<100 Å) can be deposited prior to formation of the Mo metal. Such titanium metal serves as a glue layer, among other features. In an example, the method performs a mask and pattern process to etch away Mo in field areas (leaving Mo in probe pad, coplanar waveguide (CPW) interconnect, top-plate/first electrode, via landing pad/second electrode, and alignment mark areas. In an example, titanium-aluminum (100 Å/4 um) is deposited on Mo metal in probe pad and CPW areas. In an example, Ti/Al is formed on the landing pad for subsequently deposited copper-tin metal pillars for wafer-level flip-chip package— CuSn pillars and die sawing are deposited. In an example, the method forms a dielectric passivation (25 um of Spin-on Polymer photo-dielectric (ELECTRA WLP SH32-1-1) of top-side surface, or alternatively a combination of SiN or SiO2 is formed overlying the top surface.

In an example, the method includes patterning to open bond pads and probe pads by exposing photo-dielectric and developing away dielectric material on pads. The patterning process completes an upper region of the substrate structure, before backside processing is performed. Further details of the present method can be found throughout the present specification, and more particularly below.

In an example, the substrate is provided on a flip mount wafer and mount (using photoresist) onto a carrier wafer to begin backside process. In an example, the backside processing uses a multi-step (e.g., two step) process. In an example, the wafer is thinned from about 500 um to about 300 um and less using backside grinding process, which may also include polishing, and cleaning. In an example, the backside is coated with masking material, such as photoresist, and patterned to open trench regions for the piezo material and the landing pad regions. In an example, the method includes a shallow etch process into the substrate, which can be silicon for example. In an example, the method coats the backside with photoresist to open and expose a backside region of the piezo material, which exposes a full membrane area, which includes enclosed the piezo material and the landing pad areas. In an example, the method also performs an etch until the piezo material and the landing pads are exposed. In an example, the "rib" support is feature which results from 2-step process, although there can be variations, as further described below.

In an example, the backside is patterned with photoresist to align the backside pad metal (electrode #2), interconnect and landing pad. In an example, the backside is treated using a cleaning process using dilute HCl:H2O (1:1), among other suitable processes. In an example, the method also includes deposition of about 3000 Å of Mo metal in selective areas, provided that the backside of the wafer is patterned with metal in a selective manner and not blanket deposition. In an example, the metal is formed to reduce parasitic capacitance and enables routing of backside for circuit implementation, which is beneficial for different circuit node interconnections. In an example, if desired, a thin titanium adhesion metal (<100 Å) can be deposited prior to Mo as a glue material.

In an example, the method also includes formation of a dielectric passivation (25 um of spin-on polymer photo-dielectric (e.g., ELECTRA WLP SH32-1-1) of backside side surface for mechanical stability. In an example in an alternative example, the method includes deposition of SiN and/or SiO2 to fill the backside trench region to provide suitable protection, isolation, and provide other features, if desired.

In an example, the method then separates and/or unmounts the completed substrate for transfer into a wafer carrier. The completed substrate has the devices, and overlying protection materials. In an example, the substrate is now ready for saw and break, and other backend processes such as wafer level packaging, or other techniques. Of course, there can be other variations, modifications, and alternatives.

Figure 23:
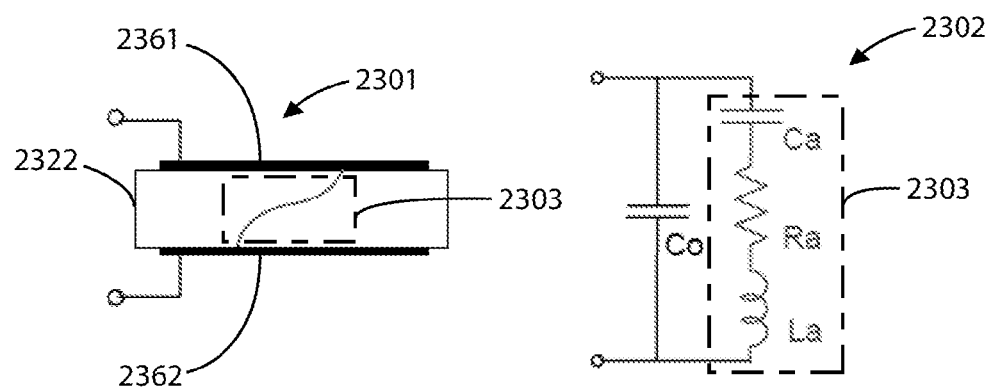
FIG. 23 illustrates circuit diagrams of the single crystal acoustic resonator device in an example of the present invention.

FIG. 23 illustrates circuit diagrams of the single crystal acoustic resonator device in an example of the present invention. This illustration is merely an example, and should not unduly limit the scope of the claims herein. Circuit 2301 shows a block diagram with the piezo membrane 2322 sandwiched between the first top electrode 2361 and the second top electrode 2362. The connection area 2303 of block diagram 2301 is represented in the circuit diagram 2302, showing an equivalent circuit configuration.

FIGS. 24-32 illustrate a manufacturing method for a single crystal acoustic resonator device in an example of the present invention. This illustration is merely an example, and should not unduly limit the scope of the claims herein.

An example of an alternative manufacturing process can be briefly described below:
1. Start;
2. Provide a substrate member, e.g., 150 mm or 200 mm diameter material, having a surface region;
3. Treat the surface region to prepare for epitaxial growth;
4. Form an epitaxial material comprising single crystal piezo material overlying the surface region to a desired thickness;
5. Pattern the epitaxial material using a masking and etching process to form a trench region by causing formation of an exposed portion of the surface region through a pattern provided in the epitaxial material; alternatively, the patterning of the epitaxial material may also occur using a laser drill technique;
6. Form topside landing pad metal, which may include a stack that has a metal layer that reacts slowly with etchants in a backside substrate etching process, as defined below;
7. Form topside electrode members, including a first electrode member overlying a portion of the epitaxial material, and a second electrode member overlying the topside landing pad metal;
8. Mask and remove (via etching) a portion of the substrate from the backside to form a single trench region exposing a backside of the epitaxial material overlying the first electrode member, and exposing a backside of the landing pad metal; a shallow "rib" structure may be formed using a two-step mask and etch process with the goal of providing mechanical support to the epitaxial material;
9. Form backside resonator metal material for the second electrode overlying the exposed portion of the epitaxial material (or piezo membrane) to form a connection from the epitaxial material to the backside of the landing pad metal coupled to the second electrode member overlying the topside landing pad metal;
10. Form resonator active area with low surface leakage current using a passivation process, which electrically and spatially isolates the first electrode member from the second electrode member on the top side, while also fine tuning the resonance capacitor; a dielectric passivation layer (such as SiN or SiO2) is deposited using PECVD technique using silane gas in a controlled temperature and pressure environment to control dielectric index of refraction;
11. Form overlying thickness of protecting dielectric material (options include SiO2, SiN, or spin-on polymer coating) overlying an upper surface region on topside surface; and
12. Perform other steps, as desired.

The aforementioned steps are provided for the formation of a resonator device using a single crystal capacitor dielectric. As shown, a pair of electrode members is configured to provide for contact from one side of the device. One of the electrode members uses a backside contact, which is coupled to a metal stack layer to configure the pair of electrodes. Of course, depending upon the embodiment, steps or a step can be added, removed, combined, reordered, or replaced, or has other variations, alternatives, and modifications. Further details of the present manufacturing process can be found throughout the present specification, and more particularly below.

Figure 24:
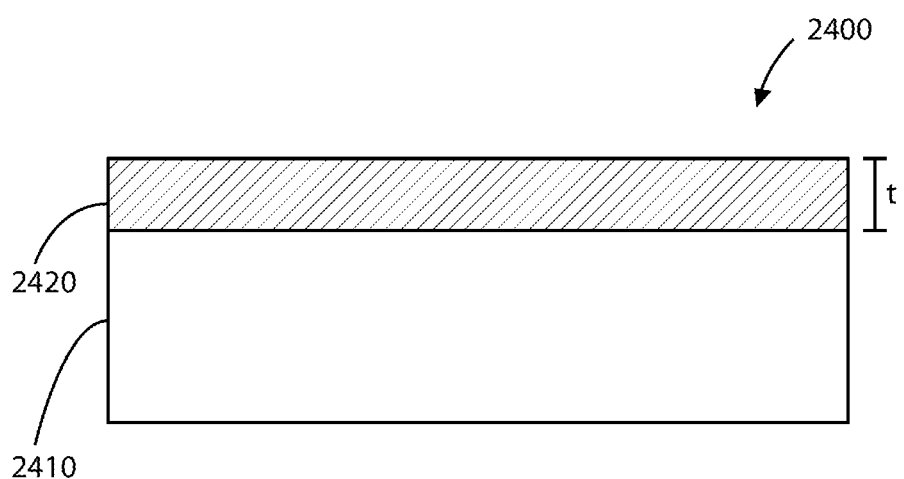
FIGS. 24-32 illustrate a manufacturing method for a single crystal acoustic resonator device in an example of the present invention.

As shown in device 2400 of FIG. 24, the method begins by providing a substrate member 2410. The substrate member has a surface region. In an example, the substrate member thickness is 400 um, which can have a diameter of 150 mm or 200 mm diameter material, although there can be variations from 50 mm to 300 mm.

In an example, the surface region of the substrate member is treated. The treatment often includes cleaning and/or conditioning. In an example, the treatment occurs in an MOCVD or LPCVD reactor with ammonia gas flowing at high temperature (e.g. in the range from 940° C. to 1100° C.) at a pressure ranging from one-tenth of an atmosphere to one atmosphere.

In an example, the method includes formation of an epitaxial material comprising single crystal piezo material 2420 overlying the surface region to a desired thickness (t), as shown. Using a configuration of Trimethylgallium (TMG), Trimethylaluminium (TMA), ammonia ($NH_3$) and hydrogen ($H_2$) gases, the epitaxial material is grown under high temperature in the range of 940° C. to 1100° C. in an atmospheric controlled environment using a MOCVD or LPCVD growth apparatus to a thickness ranging from 0.4 um to 7.0 um, depending on target resonance frequency of the capacitor device. The material also has a defect density of $10^4$ to $10^{12}$ per $cm^2$.

Figure 25:
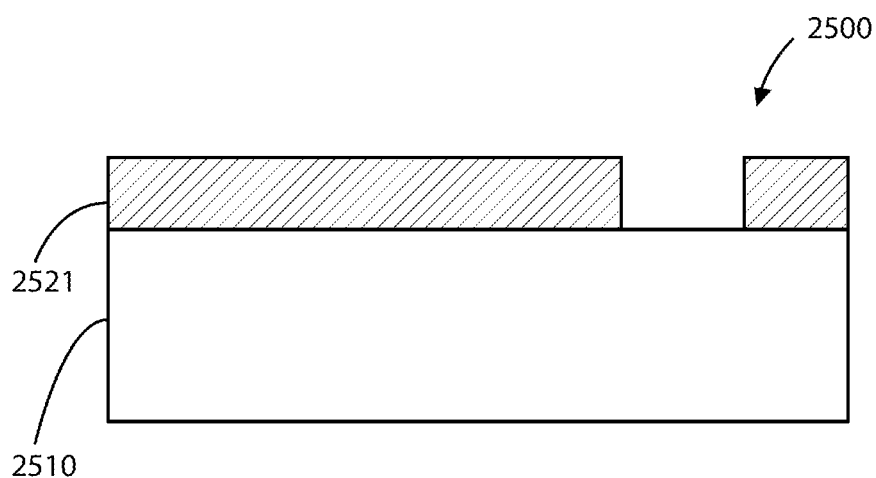
Figure 26:
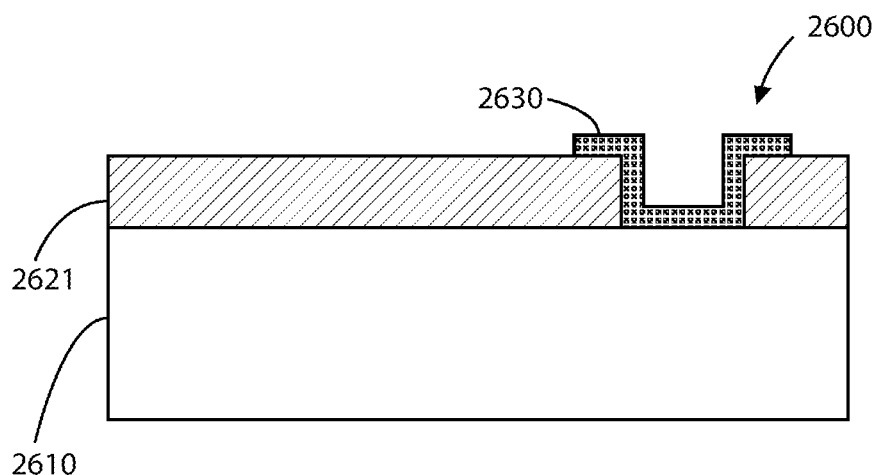

In an example, the epitaxial material 2521 is patterned (FIG. 25). Patterning involves a masking and etching process. The mask is often 1-3 um of photoresist. Etching uses chlorine-based chemistries (gases may include $BCl_3$, $Cl_2$, and/or argon) in an RIE or ICP etch tool, under controlled temperature and pressure conditions to adjust the etch rate and sidewall profile. The patterning forms a trench region (or via structure) by causing formation of an exposed portion of the surface region through a pattern provided in the epitaxial material. Here in device 2500, the epitaxial material 2521 overlies the substrate 2510 as described before.

In an example, the method forms a topside landing pad metal 2630 (FIG. 26), which may include a stack that has a metal layer that reacts slowly with etchants in a backside substrate etching process, as defined below. In an example, the metal is a refractory metal (such as tantalum, molybdenum, tungsten) or other metal (such as gold, aluminum, titanium or platinum). The metal is used subsequently as a stop region for a backside etch process, as noted. Here in device 2600, the epitaxial material 2621 and the topside landing pad metal 2630 are configured overlying the substrate member 2610 as described before.

Figure 27:
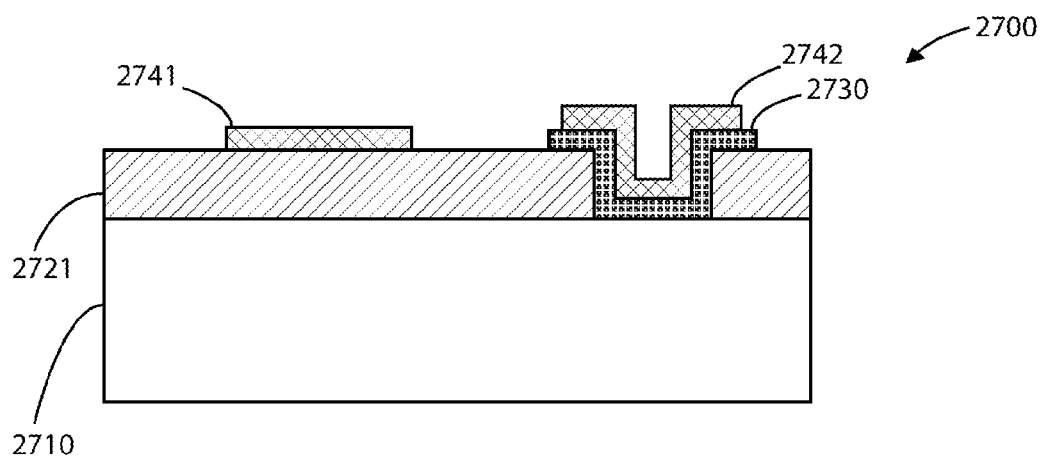
Figure 28:
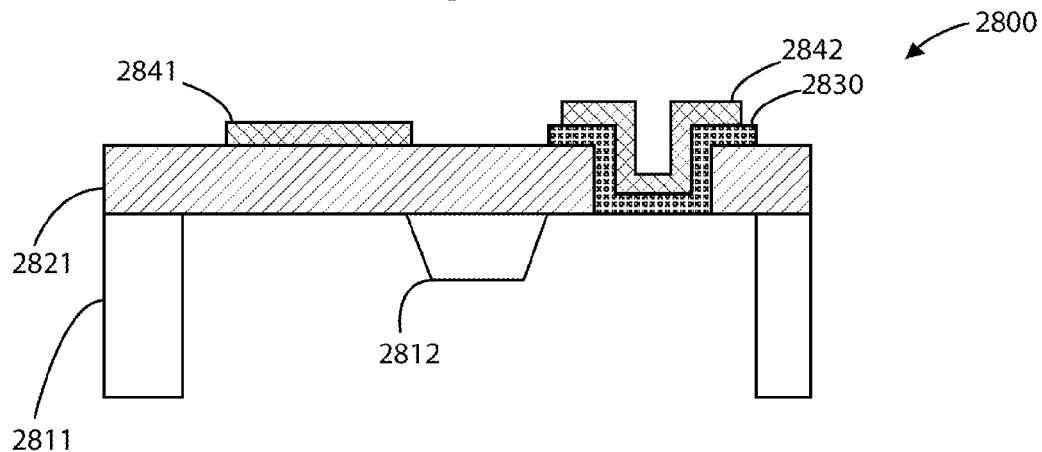
Figure 29:
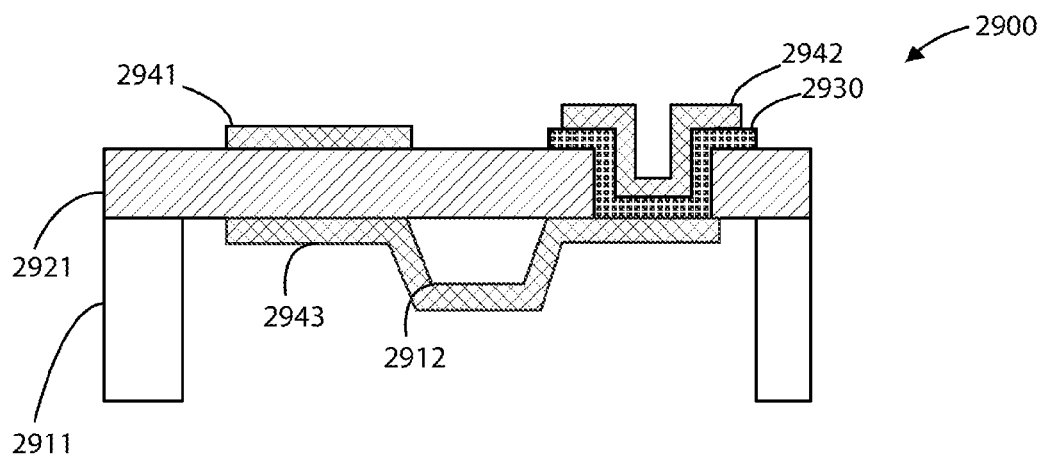
Figure 30:
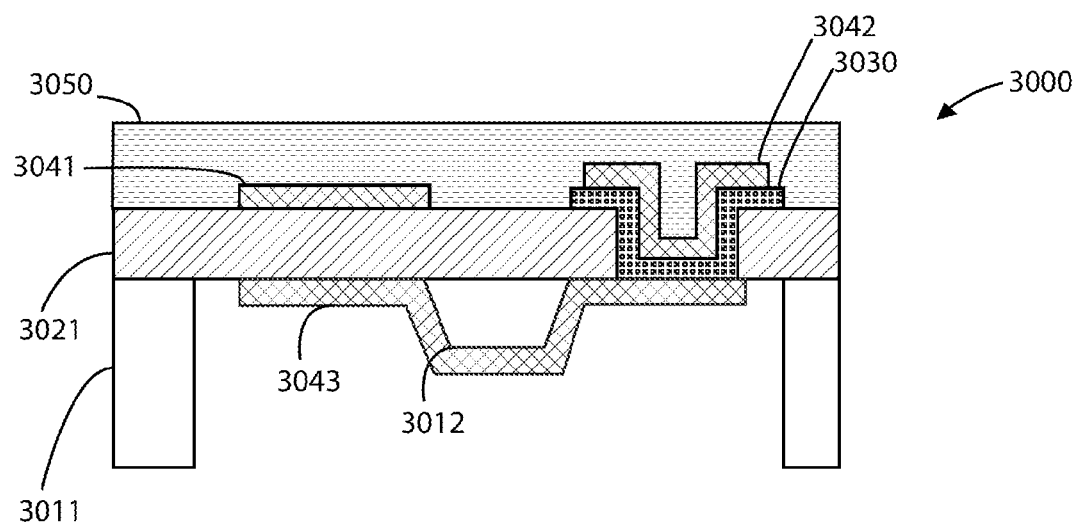

In an example, the method forms a topside metal structure (FIG. 27). The structure has topside electrode members, including a first electrode member 2741 overlying a portion of the epitaxial material, and a second electrode member 2742 overlying the topside landing pad metal, as shown. The metal structure is made using a refractory metal (such as tantalum, molybdenum, tungsten), and has a thickness of 300 nm, chosen to define the resonant frequency of the capacitor device. Here in device 2700, epitaxial material 2721, the topside landing pad metal 2730, the first electrode member 2741, and the second electrode member 2742 are configured overlying the substrate member 2710 as described before.

In an example, the method performs backside processing (FIG. 28), by flipping the substrate top-side down. In an example, the method includes a patterning process of the backside of the substrate 2811. The process uses a mask and removal process via etching a portion of the substrate from the backside to form a first trench region exposing a backside of the epitaxial material overlying the first electrode member, and a second trench region exposing a backside of the landing pad metal. A support member 2812 can be configured between the two trench regions. In an example, the support member can be recessed from a bottom side surface region, although there can be variations. In an example, etching is performed using chlorine-based gas in either an RIE or ICP reactor with temperature and pressure defined to control etch rate, selectivity and sidewall slope. Here in device 2800, epitaxial material 2821, the topside landing pad metal 2830, the first electrode member 2841, and the second electrode member 2842 are configured overlying the substrate member 2811 as described before.

Next, the method includes formation of a backside resonator metal material 2943 (FIG. 29) along the first and second trench regions of the substrate 2911 for the second electrode overlying the exposed portion of the epitaxial material (or piezo membrane) to form a connection from the epitaxial material to the backside of the landing pad metal coupled to the second electrode member overlying the topside landing pad metal. Here in device 2900, epitaxial material 2921, the topside landing pad metal 2930, the first electrode member 2941, and the second electrode member 2942 are configured overlying the substrate member 2911 as described before. The second electrode or backside resonator metal material 2943 is configured underlying the substrate 2911.

As shown in device 2900, the piezo membrane 2921 is sandwiched between the pair of electrodes 2941 and 2943, which are configured from the top-side and backside of the substrate member 2911. The member is <111> oriented silicon substrate with a resistivity of greater than 10 ohm-cm.

In an example, the method forms or patterns the resonator active area using a masking and etching process. The end objective is to electrically and spatially isolate the first electrode member from the second electrode member on the top side, while also fine tuning the resonance capacitor. In an example, the resonator active area is 200 um by 200 um. The patterning uses chlorine-based RIE or ICP etching technique.

Figure 31:
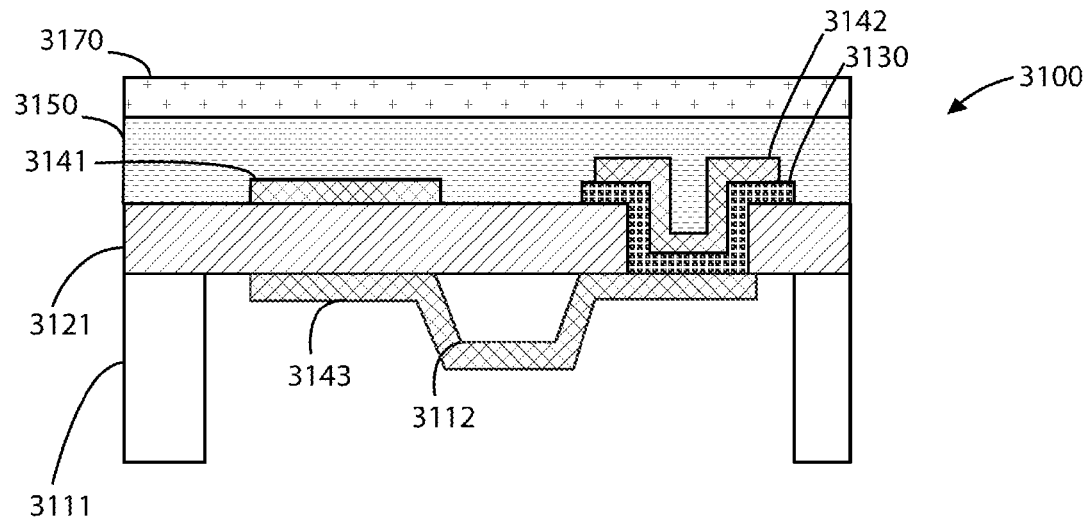

The method forms a passivation layer 3050 (FIG. 30) and a thickness of protecting material 3170 (FIG. 31). In an example, the method forms a combination of silicon dioxide, which forms a conforming structure, and an overlying silicon nitride capping material. The silicon dioxide and silicon nitride materials are formed using a combination of silane, nitrogen and oxygen sources and deposited using a PECVD chamber. Here in device 3000, epitaxial material 3021, the topside landing pad metal 3030, the first electrode member 3041, and the second electrode member 3042 are configured overlying the substrate member 3011 as described before. The passivation layer 3050 overlies the previously mention elements on substrate 3011. The second electrode or backside resonator metal material 3043 is configured underlying the substrate 3011. Similarly in device 3100, epitaxial material 3121, the topside landing pad metal 3130, the first electrode member 3141, and the second electrode member 3142 are configured overlying the substrate member 3111 as described before. The passivation material 3150 and the protecting material 3170 overlie the previously mentioned elements on the substrate 3111. The second electrode or backside resonator metal material 3143 is configured underlying the substrate 3111.

Figure 32:
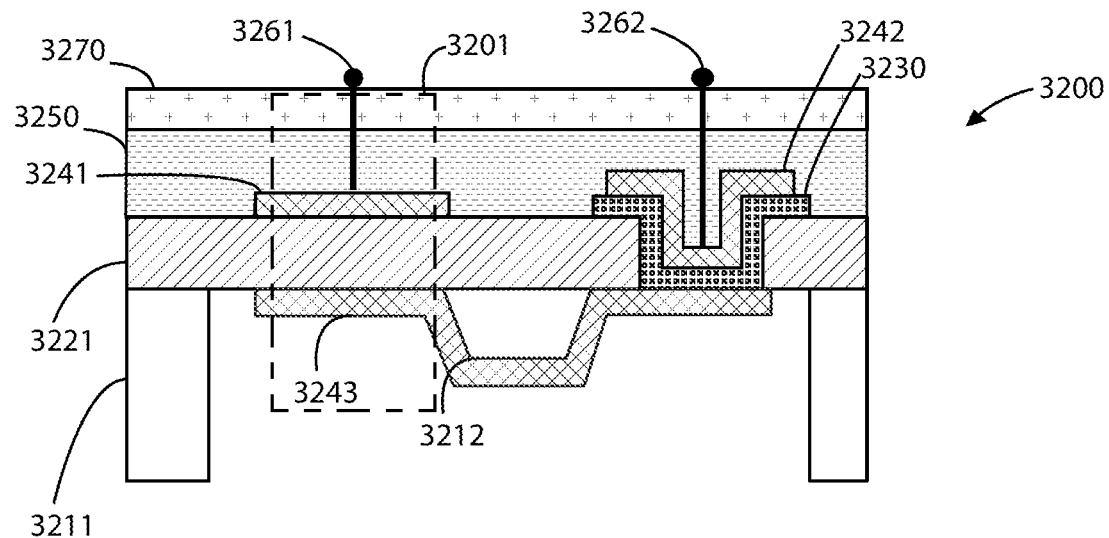

The method forms a first and second electrode (3261, 3262) that are electrically coupled to the first top electrode 3241 and second top electrode 3242, respectively (FIG. 32). The intrinsic device is marked as 3201. In an example, the method also may include other steps or other materials, as desirable. Here in device 3200, epitaxial material 3221, the topside landing pad metal 3230, the first electrode member 3241, and the second electrode member 3242 are configured overlying the substrate member 3211 as described before. The passivation material 3250 and the protecting material 3270 overlie the previously mentioned elements on the substrate 3211. The second electrode or backside resonator metal material 3243 is configured underlying the substrate 3211.

In an example, the present method can also include one or more of these processes for formation of the upper electrode structures, passivation material, and backside processing. In an example, the present substrate including overlying structures can include a surface clean using HCl:H2O (1:1) for a predetermined amount of time, followed by rinse and load into sputtering tool.

In the sputtering tool to form the electrode metallization, the method includes a molybdenum (Mo) metal (3000 Å) blanket deposition using sputtering technique on an exposed top side of the single crystal piezo material. In an example, if desired, a thin titanium adhesion metal (<100 Å) can be deposited prior to formation of the Mo metal. Such titanium metal serves as a glue layer, among other features. In an example, the method performs a mask and pattern process to etch away Mo in field areas (leaving Mo in probe pad, coplanar waveguide (CPW) interconnect, top-plate/first electrode, via landing pad/second electrode, and alignment mark areas. In an example, titanium-aluminum (100 Å/4 um) is deposited on Mo metal in probe pad and CPW areas. In an example, Ti/Al is formed on the landing pad for subsequently deposited copper-tin metal pillars for wafer-level flip-chip package— CuSn pillars and die sawing are deposited. In an example, the method forms a dielectric passivation (25 um of Spin-on Polymer photo-dielectric (ELECTRA WLP SH32-1-1) of top-side surface, or alternatively a combination of SiN or SiO2 is formed overlying the top surface.

In an example, the method includes patterning to open bond pads and probe pads by exposing photo-dielectric and developing away dielectric material on pads. The patterning process completes an upper region of the substrate structure, before backside processing is performed. Further details of the present method can be found throughout the present specification, and more particularly below.

In an example, the substrate is provided on a flip mount wafer and mount (using photoresist) onto a carrier wafer to begin backside process. In an example, the backside processing uses a multi-step (e.g., two step) process. In an example, the wafer is thinned from about 500 um to about 300 um and less using backside grinding process, which may also include polishing, and cleaning. In an example, the backside is coated with masking material, such as photoresist, and patterned to open trench regions for the piezo material and the landing pad regions. In an example, the method includes a shallow etch process into the substrate, which can be silicon for example.

In an example, the method coats the backside with photoresist to open and expose a backside region of the piezo material, which exposes a full membrane area, which includes enclosed the piezo material and the landing pad areas. In an example, the method also performs an etch until the piezo material and the landing pads are exposed. In an example, the "rib" support is feature which results from 2-step process, although there can be variations.

In an example, the backside is patterned with photoresist to align the backside pad metal (electrode #2), interconnect and landing pad. In an example, the backside is treated using a cleaning process using dilute HCl:H2O (1:1), among other suitable processes. In an example, the method also includes deposition of about 3000 Å of Mo metal in selective areas, provided that the backside of the wafer is patterned with metal in a selective manner and not blanket deposition. In an example, the metal is formed to reduce parasitic capacitance and enables routing of backside for circuit implementation, which is beneficial for different circuit node interconnections. In an example, if desired, a thin titanium adhesion metal (<100 Å) can be deposited prior to Mo as a glue material.

In an example, the method also includes formation of a dielectric passivation (25 um of spin-on polymer photo-dielectric (e.g., ELECTRA WLP SH32-1-1) of backside side surface for mechanical stability. In an example in an alternative example, the method includes deposition of SiN and/or SiO2 to fill the backside trench region to provide suitable protection, isolation, and provide other features, if desired.

In an example, the method then separates and/or unmounts the completed substrate for transfer into a wafer carrier. The completed substrate has the devices, and overlying protection materials. In an example, the substrate is now ready for saw and break, and other backend processes such as wafer level packaging, or other techniques. Of course, there can be other variations, modifications, and alternatives.

Figure 33:
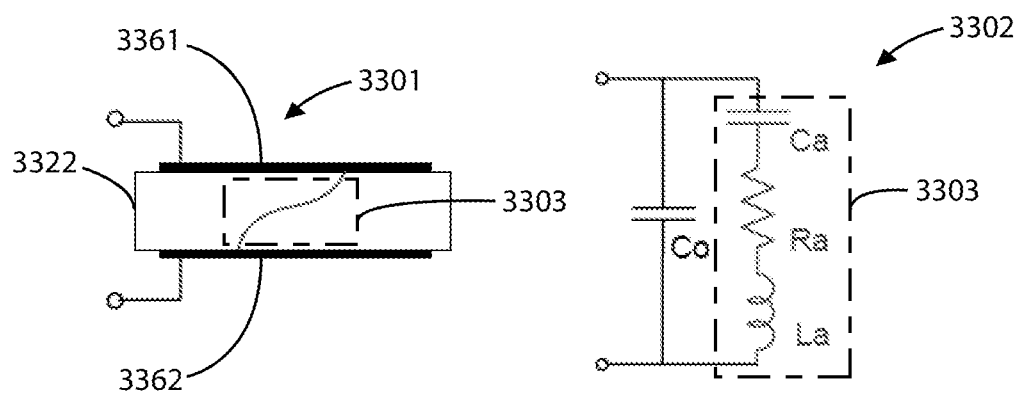
FIG. 33 illustrates circuit diagrams of the single crystal acoustic resonator device in an example of the present invention.

FIG. 33 illustrates circuit diagrams of the single crystal acoustic resonator device in an example of the present invention. This illustration is merely an example, and should not unduly limit the scope of the claims herein. Circuit 3301 shows a block diagram with the piezo membrane 3322 sandwiched between the first top electrode 3361 and the second top electrode 3362. The connection area 3303 of block diagram 3301 is represented in the circuit diagram 3302, showing an equivalent circuit configuration.

In an example, the present disclosure illustrations an acoustic reflector structure which can be added, only if needed, or desirable. In an example, the acoustic reflector on a single crystal acoustic resonator device (SCAR) device can provide improved acoustic coupling, so called $K^2$. In conventional BAW devices, an acoustic resonator is inserted into substrate/carrier material, which may be cumbersome and not efficient, although used. In an example, because a portion of the substrate is removed from backside of single crystal piezo material from the device, then the acoustic reflector is likely not needed or desired on either side of the acoustic resonator. However, in contrast to conventional bulk acoustic wave devices where reflector is integrated into the substrate, the acoustic reflector is integrated on the topside of the device where is can serve two functions: (i) reduce moisture sensitivity to SCAR device, AND (ii) provide acoustic isolation from filter device and surrounding environment (similar to a Faraday cage), among other functions. These and other features can be found throughout the present specification and more particularly below.

Figure 34:
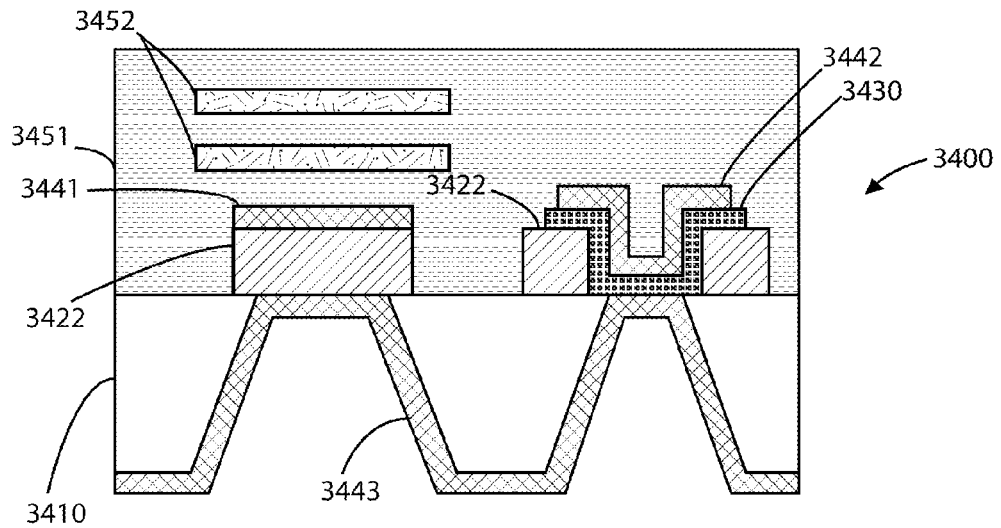
FIGS. 34 and 35 illustrate a reflector structure configured on the single crystal acoustic resonator device in an example of the present invention.
Figure 35:
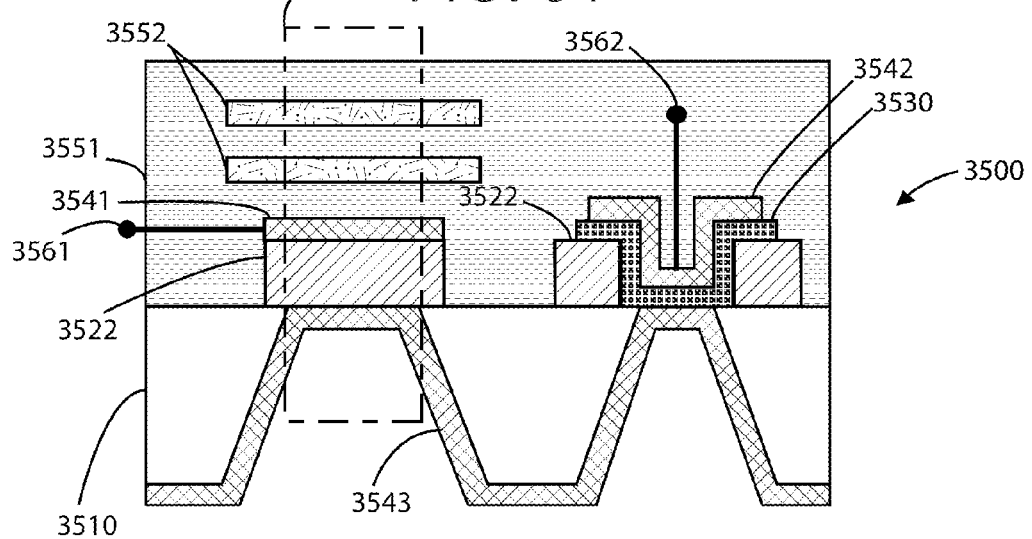

FIGS. 34 and 35 illustrate a reflector structure (3400, 3500) configured on the single crystal acoustic resonator device in an example of the present invention. As shown, the device has similar features as one of the prior examples (FIGS. 14-22). Here in device 3400, epitaxial material 3421, the topside landing pad metal 3430, the first electrode member 3441, and the second electrode member 3442 are configured overlying the substrate member 3410 as described before. The passivation material 3451 overlies the previously mentioned elements on the substrate 3410. The second electrode or backside resonator metal material 3443 is configured underlying the substrate 3410. Additionally, the device is configured with a reflector structure including alternating quarter-wave layers of high acoustic impedance 3452, 3552 (e.g. metals such as Mo, W, Cu, Ta) and low impedance materials 3451, 3551 (e.g., dielectrics such as to form acoustic reflector above acoustic resonator device). FIG. 35 also shows a first electrode 3561 horizontally coupled to the first top electrode 3541 and a second electrode 3562 vertically coupled to the second top electrode 3542. The intrinsic device is marked as 3501. Of course, there can be other variations, modifications, and alternatives. Here in device 3500, epitaxial material 3521, the topside landing pad metal 3530, the first electrode member 3541, and the second electrode member 3542 are configured overlying the substrate member 3510 as described before. The passivation material 3551 overlies the previously mentioned elements on the substrate 3510. The second electrode or backside resonator metal material 3543 is configured underlying the substrate 3510.

Figure 36:
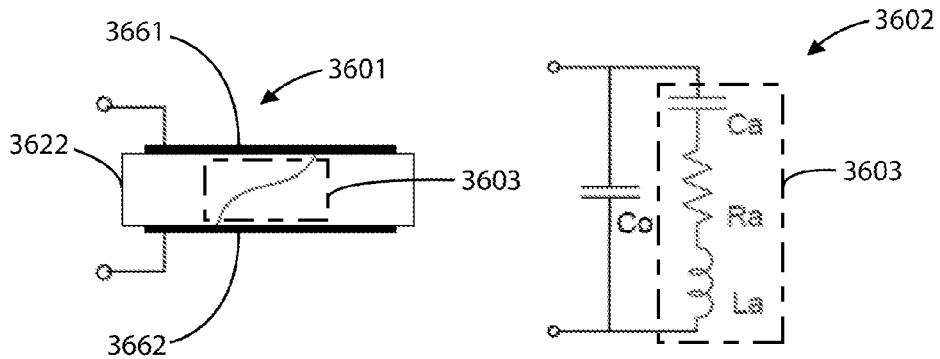
FIG. 36 illustrates circuit diagrams of the integrated reflector structure with the single crystal acoustic resonator device of the aforementioned Figures.

FIG. 36 illustrates circuit diagrams of the integrated reflector structure with the single crystal acoustic resonator device of the aforementioned Figures. This illustration is merely an example, and should not unduly limit the scope of the claims herein. As shown, circuit 3601 is a block diagram with the piezo membrane 3622 sandwiched between the first top electrode 3661 and the second top electrode 3662. The connection area 3603 of block diagram 3601 is represented in the circuit diagram 3602, showing an equivalent circuit configuration.

In an example, the present invention can provide an acoustic resonator device comprising a bulk substrate member, having a surface region, and a thickness of material. In an example, the bulk substrate has a first recessed region and a second recessed region, and a support member disposed between the first recessed region and the second recessed region.

In an example, the device has a thickness of single crystal piezo material formed overlying the surface region. In an example, the thickness of single crystal piezo material has an exposed backside region configured with the first recessed region and a contact region configured with the second recessed region. The device has a first electrode member formed overlying an upper portion of the thickness of single crystal piezo material and a second electrode member formed overlying a lower portion of the thickness of single crystal piezo material to sandwich the thickness of single crystal piezo material with the first electrode member and the second electrode member. In an example, the second electrode member extends from the lower portion that includes the exposed backside region to the contact region. In an example, the device has a second electrode structure configured with the contact region and a first electrode structure configured with the first electrode member.

As shown, the device also has a dielectric material overlying an upper surface region of a resulting structure overlying the bulk substrate member. The device has an acoustic reflector structure configured overlying the first electrode member, the upper portion, the lower portion, and the second electrode member. As shown, the acoustic reflector structure has a plurality of quarter wave layers configured spatially within the dielectric material.

Figure 37:
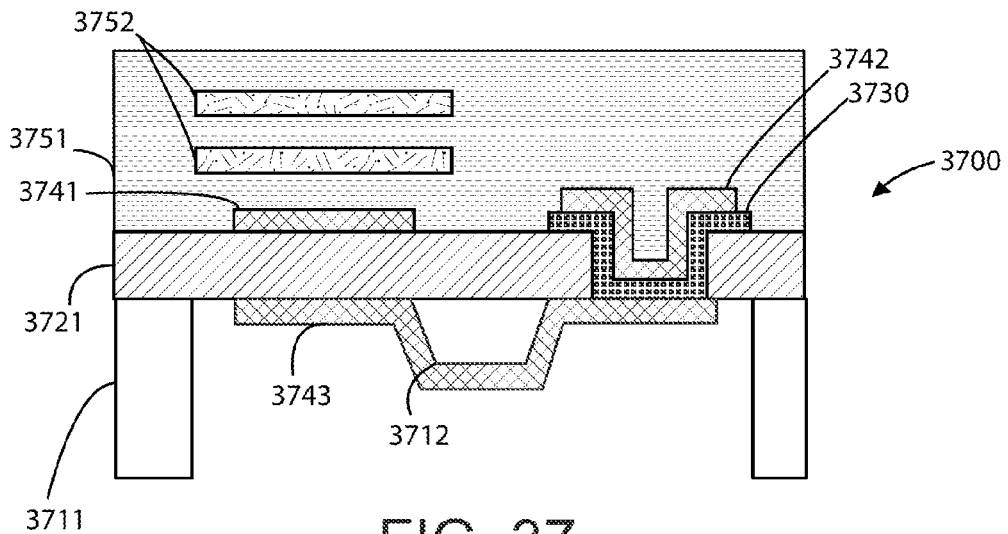
FIGS. 37 and 38 illustrate a reflector structure configured on the single crystal acoustic resonator device in an example of the present invention
Figure 38:
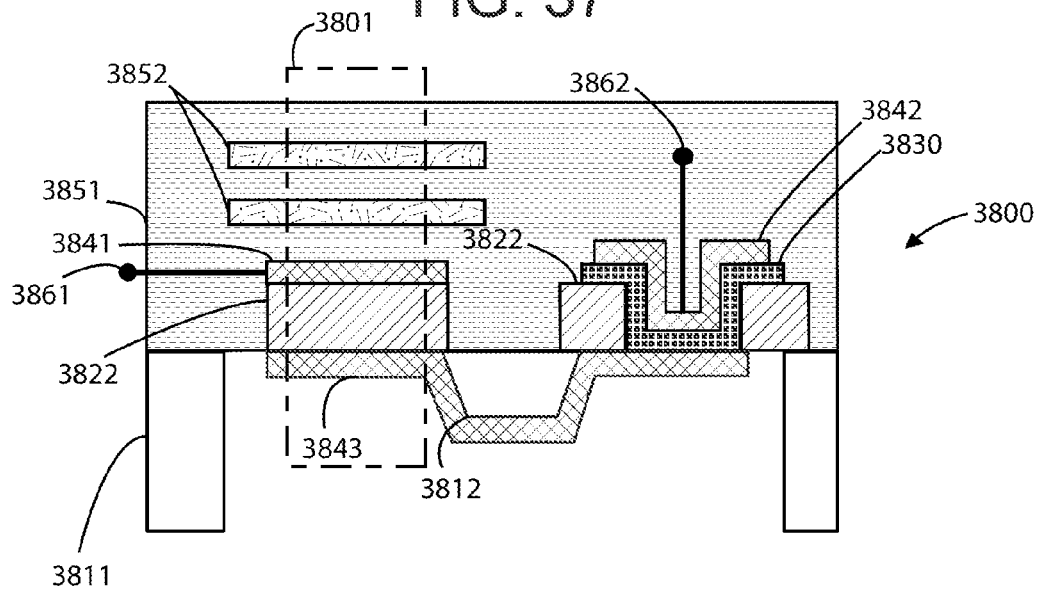

FIGS. 37 and 38 illustrate a reflector structure (3700, 3800) configured on the single crystal acoustic resonator device in an example of the present invention. This illustration is merely an example, and should not unduly limit the scope of the claims herein. As shown, the device has similar features as one of the prior examples (FIGS. 24-32). Here in device 3700, epitaxial material 3721, the topside landing pad metal 3730, the first electrode member 3741, and the second electrode member 3742 are configured overlying the substrate member 3711 as described before. The passivation material 3751 overlies the previously mentioned elements on the substrate 3711. The second electrode or backside resonator metal material 3743 is configured underlying the substrate 3711. Similarly in device 3800, epitaxial material 3821, the topside landing pad metal 3830, the first electrode member 3841, and the second electrode member 3842 are configured overlying the substrate member 3811 as described before. The passivation material 3851 overlies the previously mentioned elements on the substrate 3811. The second electrode or backside resonator metal material 3843 is configured underlying the substrate 3811. Additionally, the device is configured with a reflector structure including alternating quarter-wave layers of high acoustic impedance 3752, 3852 (e.g. metals such as Mo, W, Cu, Ta) and low impedance materials 3751, 3752 (e.g., dielectrics such as to form acoustic reflector above acoustic resonator device). FIG. 38 also shows a first electrode 3861 horizontally coupled to the first top electrode 3841 and a second electrode 3862 vertically coupled to the second top electrode 3842. The intrinsic device is marked as 3801. Of course, there can be other variations, modifications, and alternatives.

Figure 39:
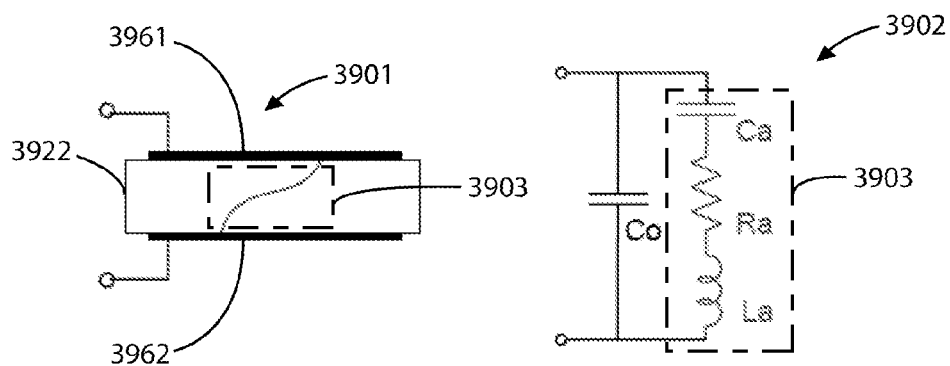
FIG. 39 illustrates circuit diagrams of the integrated reflector structure with the single crystal acoustic resonator device of the aforementioned Figures.

FIG. 39 illustrates circuit diagrams of the integrated reflector structure with the single crystal acoustic resonator device of the aforementioned Figures. This illustration is merely an example, and should not unduly limit the scope of the claims herein. As shown, circuit 3901 is a block diagram with the piezo membrane 3922 sandwiched between the first top electrode 3961 and the second top electrode 3962. The connection area 3903 of block diagram 3901 is represented in the circuit diagram 3902, showing an equivalent circuit configuration.

In an example, the present invention can provide an acoustic resonator device comprising a bulk substrate member, having a surface region, and a thickness of material. In an example, the bulk substrate has a first recessed region and a second recessed region, and a support member disposed between the first recessed region and the second recessed region.

In an example, the device has a thickness of single crystal piezo material formed overlying the surface region. In an example, the thickness of single crystal piezo material has an exposed backside region configured with the first recessed region and a contact region configured with the second recessed region. The device has a first electrode member formed overlying an upper portion of the thickness of single crystal piezo material and a second electrode member formed overlying a lower portion of the thickness of single crystal piezo material to sandwich the thickness of single crystal piezo material with the first electrode member and the second electrode member. In an example, the second electrode member extends from the lower portion that includes the exposed backside region to the contact region. In an example, the device has a second electrode structure configured with the contact region and a first electrode structure configured with the first electrode member.

As shown, the device also has a dielectric material overlying an upper surface region of a resulting structure overlying the bulk substrate member. The device has an acoustic reflector structure configured overlying the first electrode member, the upper portion, the lower portion, and the second electrode member. As shown, the acoustic reflector structure has a plurality of quarter wave layers configured spatially within the dielectric material.

Figure 40:
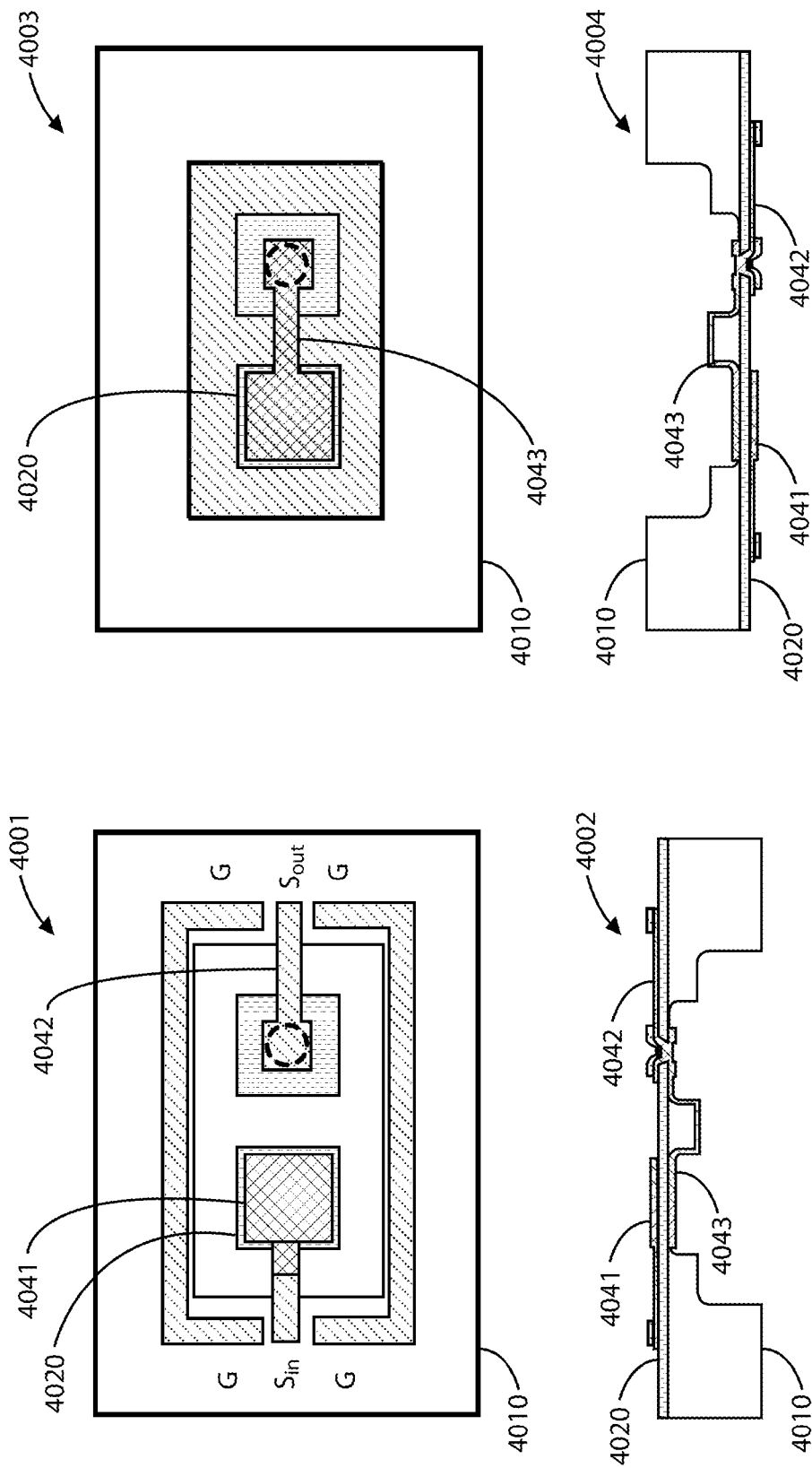
FIG. 40 illustrates simplified diagrams of a bottom surface region and top surface region for the single crystal acoustic resonator device in an example of the present invention.

FIG. 40 illustrates simplified diagrams of a bottom surface region and top surface region for the single crystal acoustic resonator device in an example of the present invention. As shown, FIG. 40 includes a top view 4001 and bottom view 4003, each with a corresponding cross-sectional view 4002 and 4004, respectively. These views show a resonator device similar to those described previously. A piezo membrane 4020 is disposed overlying a substrate 4010. The top side of the device includes a first and second top electrode 4041, 4042. The etched underside of the substrate includes a bottom electrode 4043. Of course, there can be variations, modifications, and alternatives.

Figure 41:
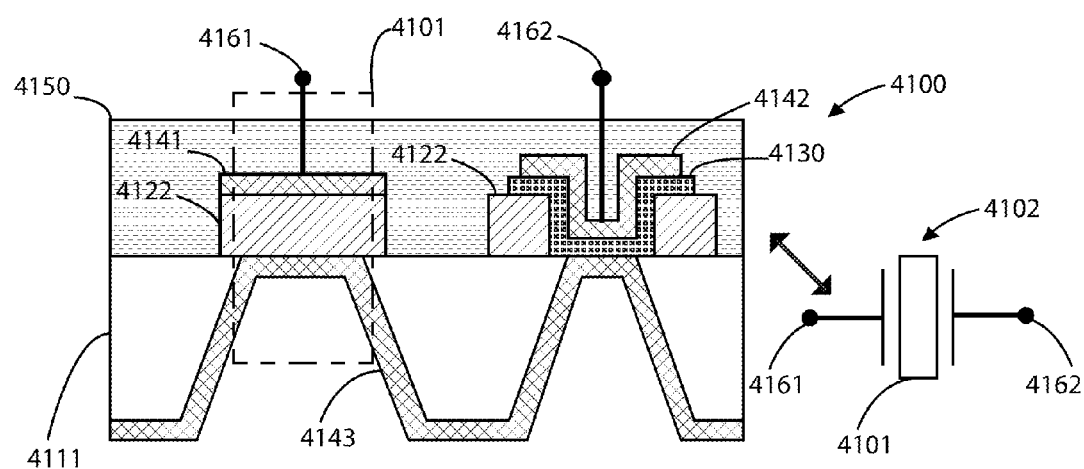
FIGS. 41 and 44 illustrate simplified examples of a single crystal acoustic resonator device configured in a filter ladder network in an example of the present invention.
Figure 44:
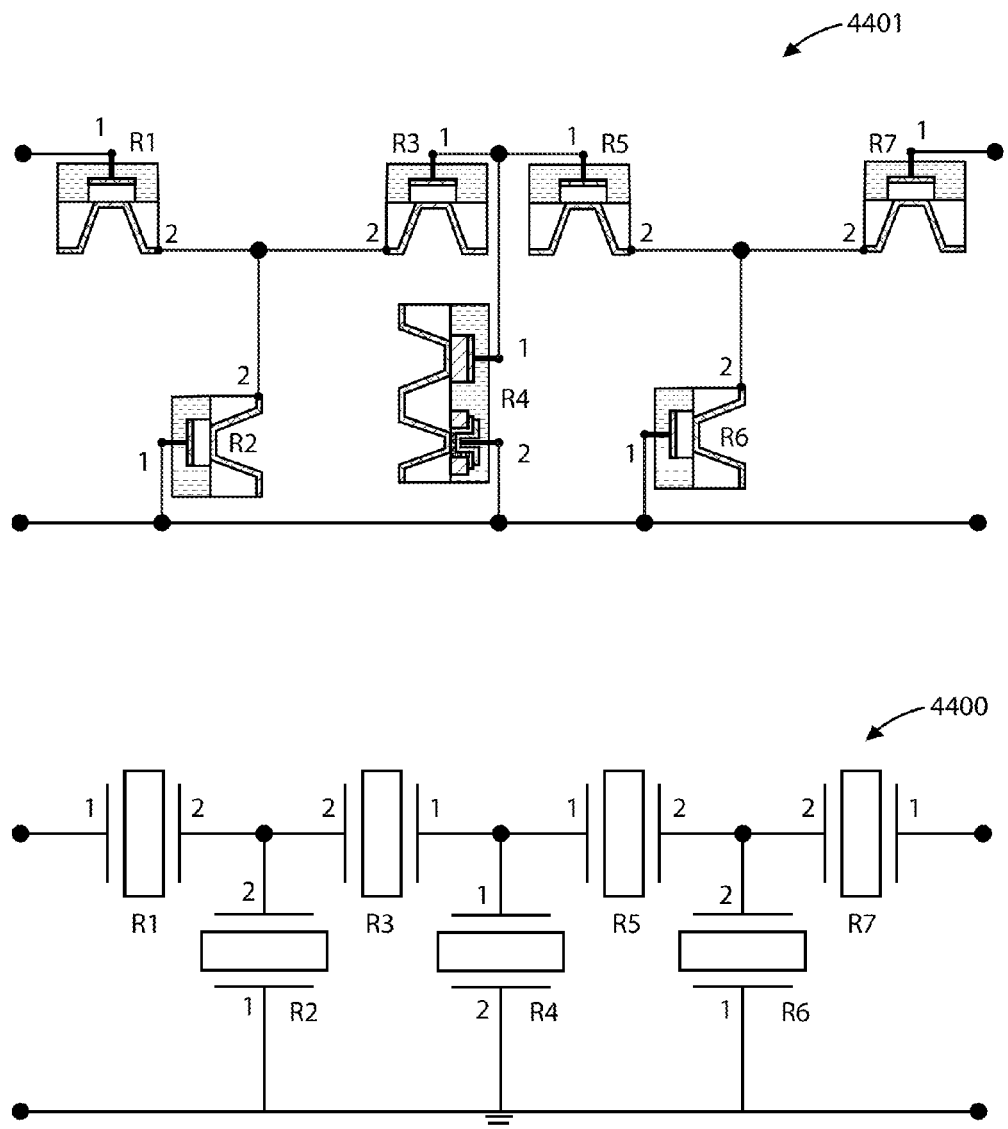

FIGS. 41 and 44 illustrate simplified examples of a single crystal acoustic resonator device configured in a filter ladder network in an example of the present invention. This illustration is merely an example, and should not unduly limit the scope of the claims herein. In examples, the following description provides illustrations and fabrication processes for manufacturing two-or-more resonators together to produce a SCAR filter, among other elements.

Referring to FIG. 41, the method begins by taking physical implementation for SCAR device 4100 (details found in FIG. 22) and translating into circuit element 4102, as shown. Here in device 4100, resonator active area 4122, the topside landing pad metal 4130, the first electrode member 4141, and the second electrode member 4142 are configured overlying the substrate member 4111 as described before. The passivation material 4150 overlies the previously mentioned elements on the substrate 4111. The second electrode or backside resonator metal material 4143 is configured underlying the substrate 4111. A first electrode structure or first electrode 4161 is electrically coupled to the first electrode member 4141, while a second electrode structure or second electrode 4162 is electrically coupled to the second electrode member 4142. The circuit element 4102 includes a first electrode 4161, a second electrode 4162, and a resonance circuit device 4101 in between the two electrodes. In an example, each of the acoustic resonator devices comprises a bulk substrate structure, having a surface region, and a thickness of material. In an example, the bulk substrate structure has a first recessed region and a second recessed region, and a support member disposed between the first recessed region and the second recessed region. Of course, there can be variations.

In an example, the device has a thickness of single crystal piezo material formed overlying the surface region. In an example the thickness of single crystal piezo material has an exposed backside region configured with the first recessed region and a contact region configured with the second recessed region. In an example, the single crystal piezo material has a thickness of greater than 0.4 microns, although there can be variations. In an example, the single crystal piezo material is characterized by a dislocation density of less than $10^{12}$ defects/cm2, while there can be variations.

In an example, the device has a first electrode member formed overlying an upper portion of the thickness of single crystal piezo material and a second electrode member formed overlying a lower portion of the thickness of single crystal piezo material to sandwich the thickness of single crystal piezo material with the first electrode member and the second electrode member, the second electrode member extending from the lower portion that includes the exposed backside region to the contact region. In an example, a second electrode structure is configured with the contact region and a first electrode structure is configured with the first electrode member. In an example, the device has a dielectric material overlying an upper surface region of a resulting structure overlying the bulk substrate member and an acoustic reflector structure configured overlying the first electrode member, the upper portion, the lower portion, and the second electrode member.

Alternatively, the device can include any of the other aforementioned features, and others. Of course there can be other variations, modifications, and alternatives. Further details of the present examples can be found throughout the present specification and more particularly below.

Figure 42:
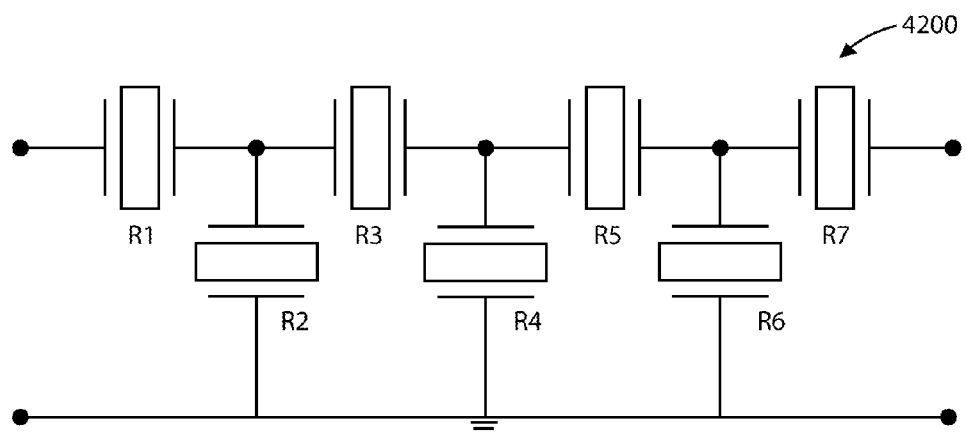

Referring to FIG. 42, a series shunt configuration 4200 of circuit elements R1, R2, R3, R4, R5, R6, and R7 are shown, although there can be variations and modifications. That is, the configuration can include a greater quantity of resonators or fewer, depending upon the example. As shown, the illustration configures a filter ladder network used in an acoustic filter that is made up of series-shunt configure SCARs.

Figure 43:
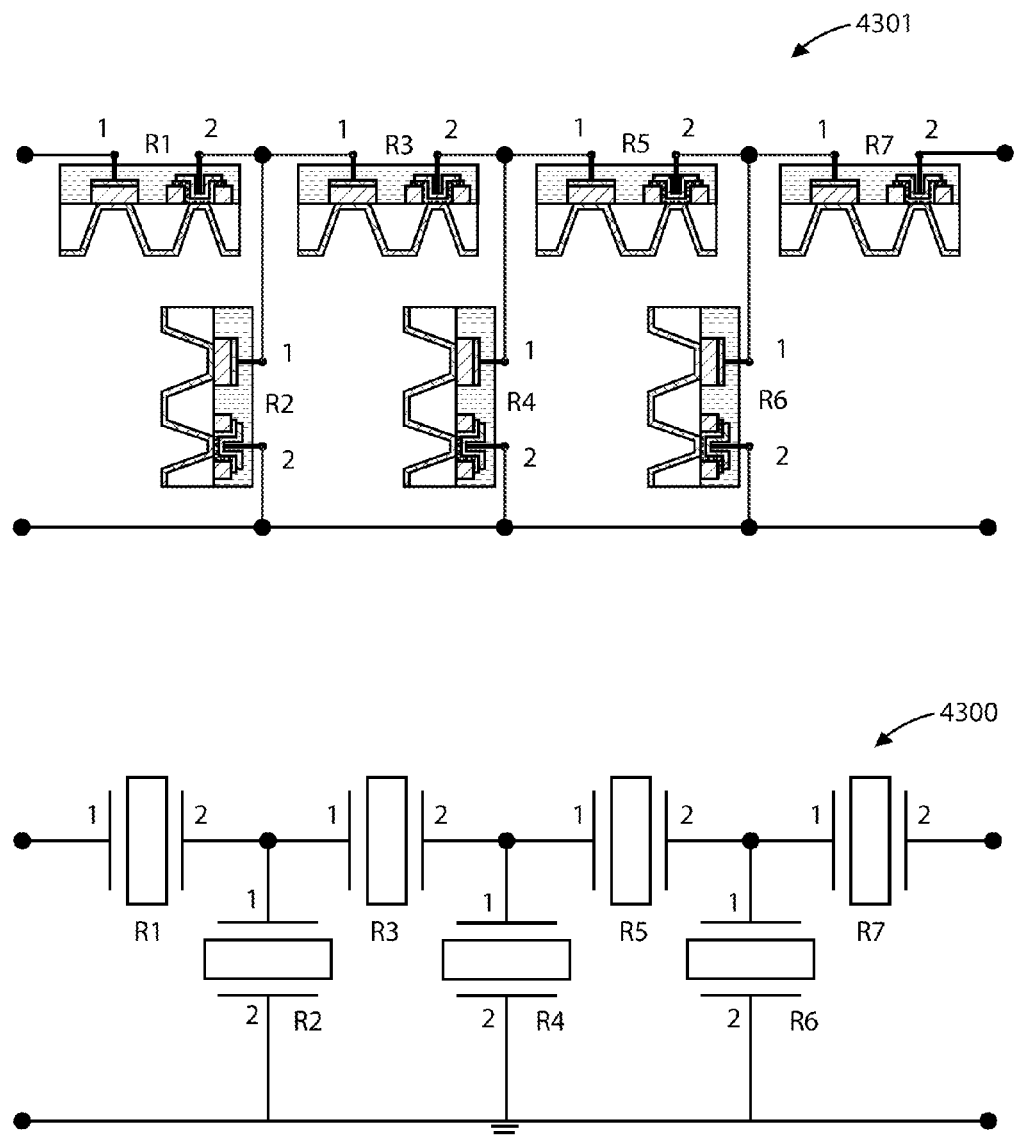

Referring now to FIG. 43, the monolithic filter ladder network 4301 has a plurality of single crystal acoustic resonator devices numbered from R1, R2, R3, R4, R5, R6, and R7 are configured on a common substrate member. Circuit diagram 4300 corresponds to the device configuration 4301. Of course, there can be a greater quantity or fewer devices that have been configured together.

In an example, each of the acoustic resonator device comprises a bulk substrate structure, having a surface region, and a thickness of material. In an example, the bulk substrate structure has a first recessed region and a second recessed region, and a support member disposed between the first recessed region and the second recessed region. Of course, there can be variations.

In an example, the device has a thickness of single crystal piezo material formed overlying the surface region. In an example the thickness of single crystal piezo material has an exposed backside region configured with the first recessed region and a contact region configured with the second recessed region. In an example, the single crystal piezo material has a thickness of greater than 0.4 microns, although there can be variations. In an example, the single crystal piezo material is characterized by a dislocation density of less than $10^{12}$ defects/cm2, while there can be variations.

In an example, the device has a first electrode member formed overlying an upper portion of the thickness of single crystal piezo material and a second electrode member formed overlying a lower portion of the thickness of single crystal piezo material to sandwich the thickness of single crystal piezo material with the first electrode member and the second electrode member, the second electrode member extending from the lower portion that includes the exposed backside region to the contact region. In an example, a second electrode structure is configured with the contact region and a first electrode structure is configured with the first electrode member. In an example, the device has a dielectric material overlying an upper surface region of a resulting structure overlying the bulk substrate member and an acoustic reflector structure configured overlying the first electrode member, the upper portion, the lower portion, and the second electrode member. Alternatively, the device can include any of the other aforementioned features, and others.

As shown, R1, R3, R5, and R7 are configured in a serial manner such that the second electrode structure of R1 is coupled to the first electrode structure of R3 and the second electrode structure of R3 is coupled to the first electrode structure of R5 and the second electrode structure of R5 is coupled to the first electrode structure of R7. The circuit further comprises a first node configured between the second electrode structure of R2 and the first electrode structure of R3, a second node is configured between the second electrode structure of R3 and the first electrode structure of R5, and a third node is configured between the second electrode structure of R5 and the first electrode structure of R7.

In an example, R2 is configured between the first node and a lower common electrode such that the first electrode structure of R2 is connected to the first node and the second electrode structure of R2 is connected to the lower common electrode. In an example, R4 is configured between the second node and the lower common electrode such that the first electrode structure is connected to the second node and the second electrode structure is connected to the lower common electrode. In an example, R6 is configured between the third node and the lower common electrode such that the first electrode structure of R6 is connected to the third node and the second electrode structure of R6 is connected to the lower common electrode.

In an example, given the single device has both electrodes on the top surface (or a common side) due to the use of a backside via (from backside electrode 2 to topside electrode 2), the present circuit is wired accordingly with each SCAR device having a backside via as shown in top right. In an example, seven backside vias are included that may consume greater portions of the substrate structures. Further examples of the present circuit devices can be found throughout the present specification and more particularly below.

Referring to FIG. 44, the following illustration configures a filter with reduced or even minimal use of vias to save substrate area. Circuit diagram 4400 corresponds to the device configuration 4401. In an example, the range of values for the present filter configuration is from seven down to one, or a single via (shown right). In an example, the present illustration uses the following boundary conditions: (1) Input of R1 and output of R7 are arranged such they are both topside node 1; (2) maximize the number of internal nodes, which use common node, and (3) the common node (bottom of R2, R4, R6) combine at the top surface of the substrate. As shown, only a single via is included, which leads to savings in expense, processing, and substrate area. Of course, there are multiple examples that can range from the single via to seven vias or more.

In an example, the second electrodes are shared on a common internal node using a backside connection and metallization. In an example, the first electrodes are shared using a top side connection, which couple each of them together. In an example, only R4 has a via structure, which couples to the lower common electrode member. Of course, there can be variations, modifications, and alternatives. In an example, the fewer vias leads to less parasitic capacitance or other loads, and reduces processes, and improves substrate usage, which are beneficial for the manufacture of highly integrated devices.

FIGS. 45 to 52 illustrate simplified examples of two and three element single crystal acoustic resonator devices according to examples of the present invention. This illustration is merely an example, and should not unduly limit the scope of the claims herein. In examples, the following description provides illustrations for two- or three-element SCAR devices, which are useful at the circuit level to implement a filter. In an example, some devices do not include a via structure, which is beneficial and more efficient.

Figure 45:
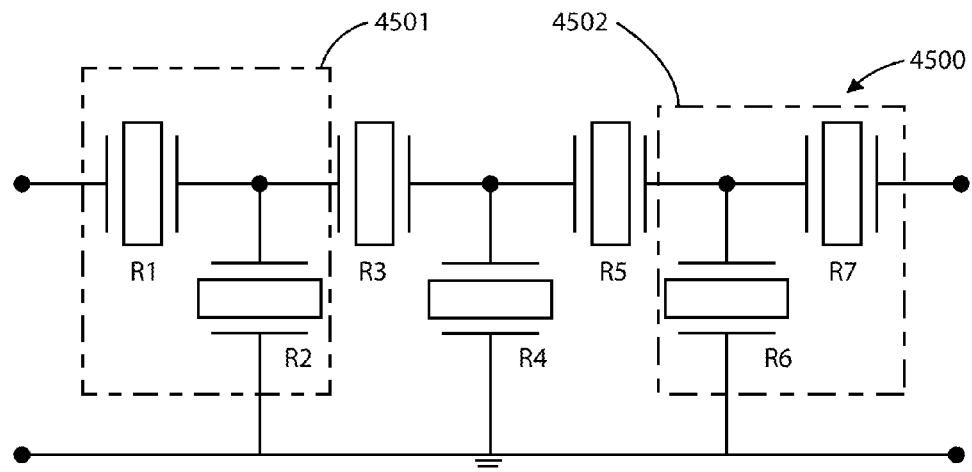
FIGS. 45 to 52 illustrate simplified examples of two and three element single crystal acoustic resonator devices according to examples of the present invention.

Referring to FIG. 45, the illustration shows a filter ladder structure 4500 discussed earlier, which can be configured from two element devices, R1, R2, R3, R4, R5, R6, and R7 in an example. As shown, R1 and R2 can be configured to form a series shunt two-element device 4501 in an example. As shown, R6 and R7 can be configured to form a series shunt two-element device 4502 in an example. Of course, there can be other variations.

Figure 46:
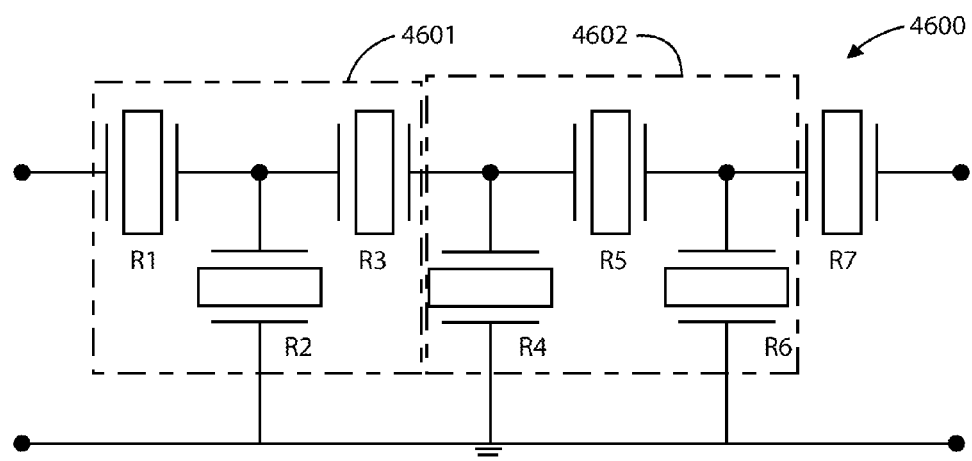
Figure 47:
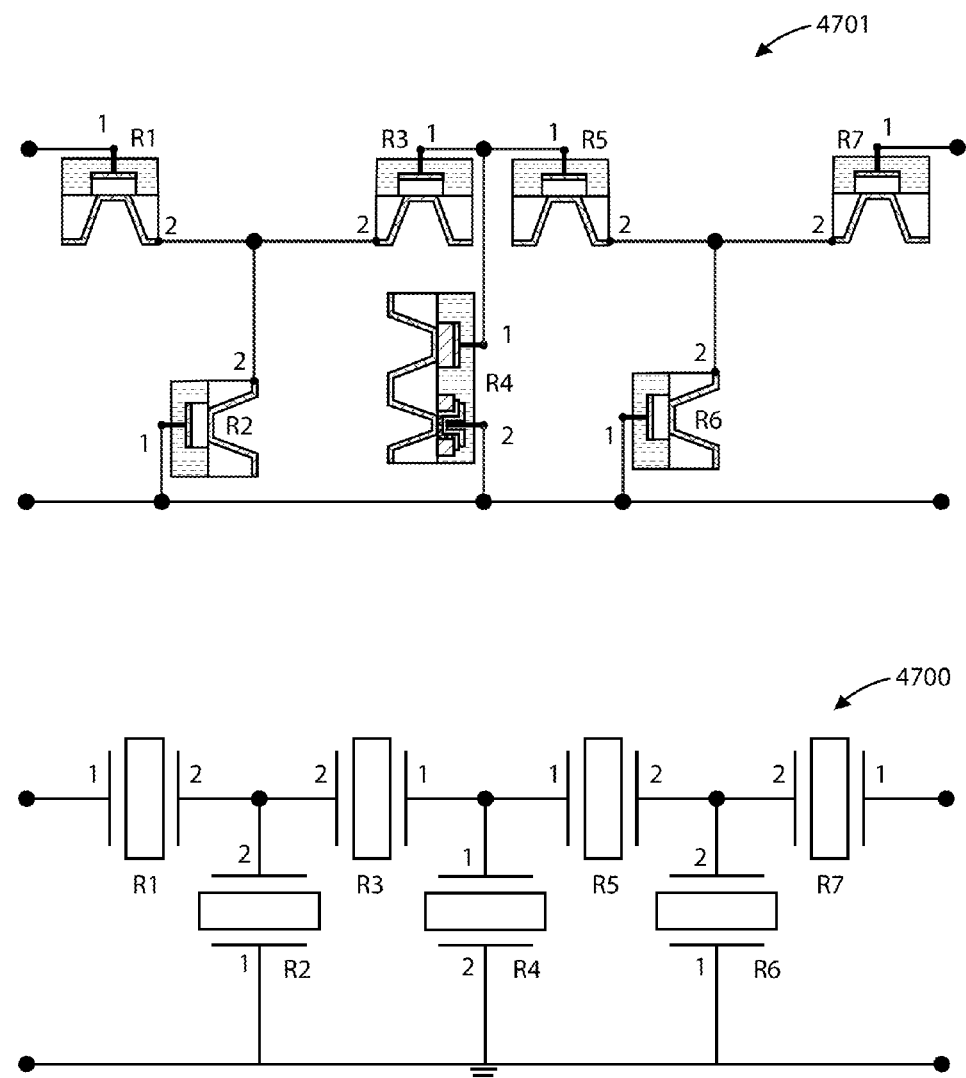

Referring to FIG. 46, the illustration shows the same filter ladder structure 4600 discussed earlier can be constructed three element "Y" and "Pi" devices in an example. In an example, R1, R2 and R3 can be configured to make up a series-shunt-series "Y" element SCAR device 4601. In an example, R4, R5 and R6 can be configured to make up a shunt-series-shunt three-element "Pi" SCAR device 4602. In an example, other three element "Y" and "Pi" SCAR devices can be constructed from this network, e.g., R5-R6-R7 make up a "Y" device, R2-R3-R4 make up a "Pi" device. Of course, there can be other alternatives, modifications, and variations. In an example, which refers to FIG. 47, the illustration can provide a lowest count of vias in a SCAR filter or any desirable count, depending upon the embodiment. FIG. 47 can show a similar configuration (4700/4701) to that shown in FIG. 44 (4400/4401). Further details of the present examples, can be found throughout the present specification and more particularly below.

Figure 48:
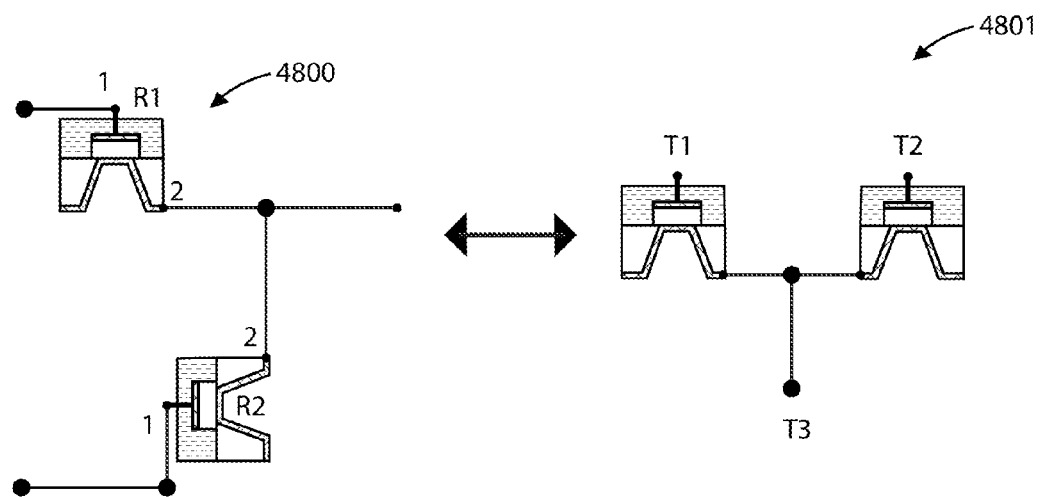

In an example, the description illustrates a series-shunt two-element three-terminal SCAR device by FIG. 48. In an example, R1 & R2, among other combinations, as noted can be configured from two simple SCAR structures. In an example, such two-element device 4801 has no vias, and two terminals including T1, T2, which are on a top side of the substrate member and a third-terminal (T3) is on backside of the substrate. In an example, the description illustrates the shunt-series two-element three terminal SCAR device 4800. In an example, referencing R1-R2 from left-to-right, a series-shunt device is illustrated. From right-to-left to left, a shunt-series device is illustrated and has the same physical structure as the aforementioned device. Of course, there can be other variations, modifications, and alternatives.

Figure 49:
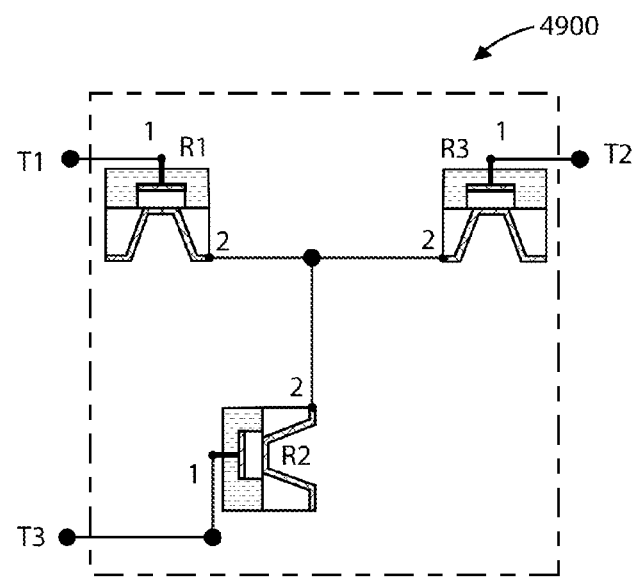

Referring now to FIG. 49, the description illustrates a "Y" three-terminal SCAR device without via structure, which reduces the size of the device. As shown and has been described, R1, R2, and R3, among other combinations, form a three-element three terminal "Y" configured SCAR device 4900 in an example. Such example has notable feature, such as no via structures, T1, T2, T3 are connections configured on the topside of the substrate member for bonding wires. In an example, the device also has node two (2), which is common for R1, R2, and R3, and configured "internally" and connected on the backside of the substrate member. In an example, the device is a series shunt series configuration, and has three separate SCAR regions corresponding to three devices to make up the "Y" configuration device.

Figure 50:
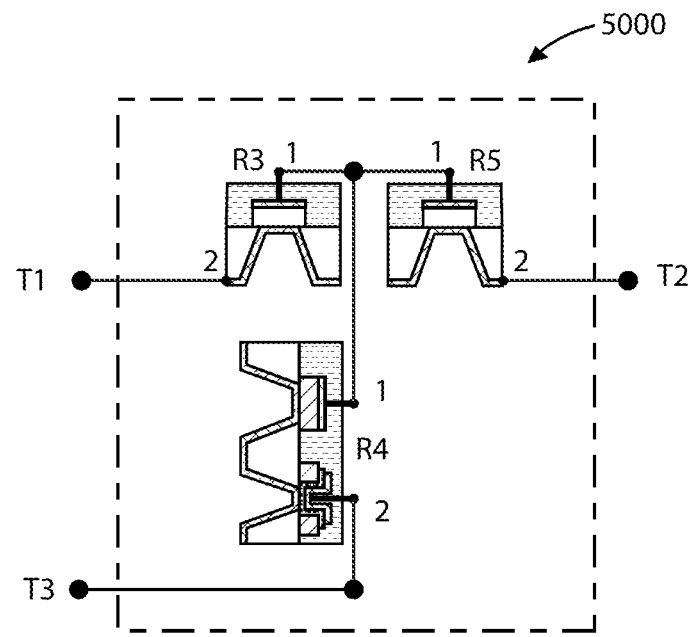

Referring now to FIG. 50, the description illustrates a "Y" three-terminal SCAR device with a single via structure, which reduces the size of the device. As shown and has been described, R3, R4, and R5, among other combinations, form a three-element three terminal "Y" configured SCAR device 5000 in an example. Such example has notable features, such as a single via on a backside connected to a front-side or topside of the substrate member. In an example, the device also has T1 and T2 contacts configured to and accessible to the backside of the substrate. T3 is configured to and accessible to the front-side of the substrate. The node one (1), which is common for R3, R4, and R5, is configured "internally" and is connected on the frontside of the substrate member. In an example, the device is a series shunt series configuration, and has three separate SCAR regions corresponding to three devices to make up the "Y" configuration device.

Figure 51:
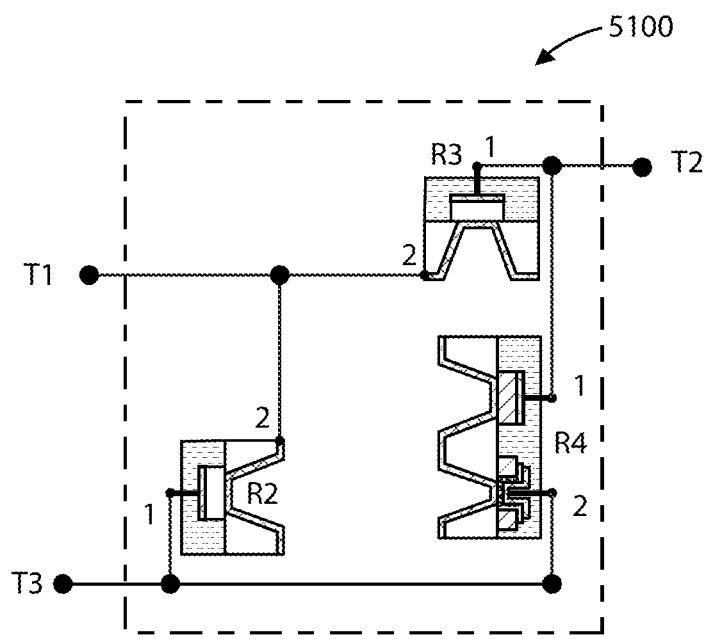

Referring to FIG. 51, the description illustrates a "Pi", three-terminal SCAR device with a single via structure in an example. As shown in the illustration, R2, R3, and R4, among other combinations, form a three-element, three terminal "Pi" configured SCAR device 5100. Such device has notable features such as a single backside via structure to route a backside connect to a front-side of the substrate. In an example, node two (2) for each of the devices R2 and R3 are connected to one another on the backside and form terminal 1 (T1). In an example, terminal 3, which is T3, is a contact that is accessible to the front-side of substrate. In an example, nodes one (1) 1 for each device R3 and R4 are configured to and connected on the front-side and form terminal 2 (T2). In an example, the device is a shunt series shunt configuration. In an example, the device includes three separate SCAR regions for corresponding to the three devices to form three (3) elements which form and make-up the "Pi" configuration. As shown is a simplified illustration of a shunt series shunt three (3)-element, three terminal "Pi" SCAR device having a single via structure on the R4 shunt leg or member. Of course, there can be variations, alternatives, and modifications.

Figure 52:
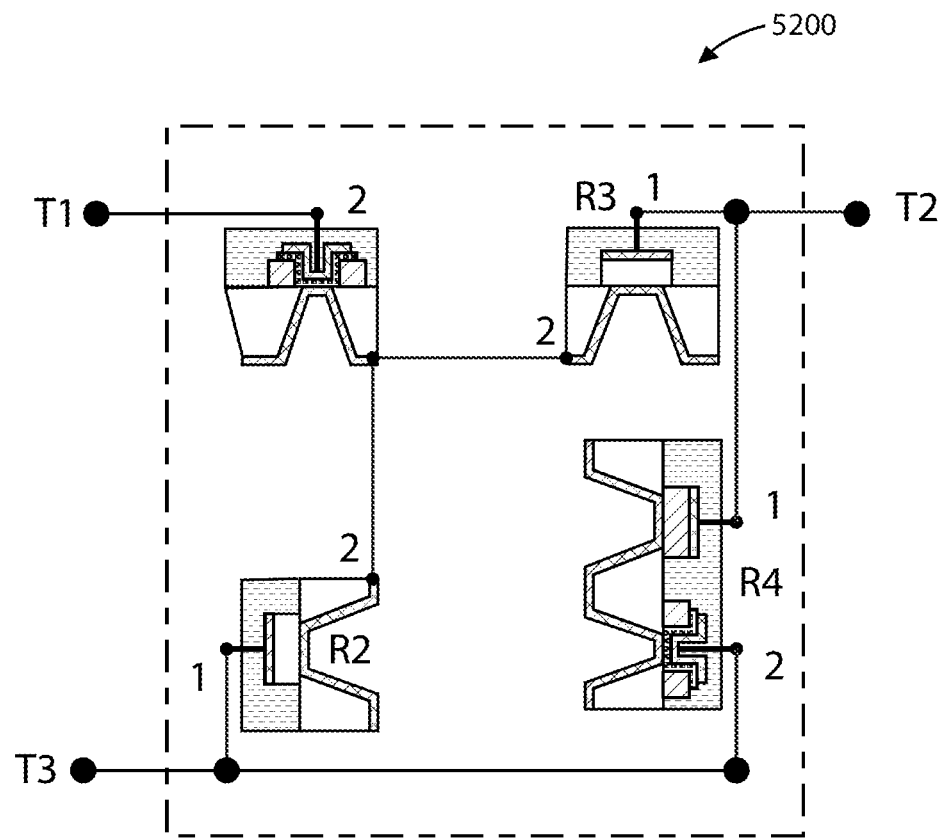

Referring to FIG. 52, the description illustrates a "Pi", three-terminal SCAR device with two (2) backside via structures in an example. As shown, the device has been mentioned in an earlier example, however, the present device has an additional via on terminal 1 (T1) configured the contact region from backside to front-side in this example. In an example, the device has notable features, such as two (2) backside via structures to route the backside contact region to connect to the front-side of the substrate. In an example, the device has node two (2) for each device elements R2 and R3 that are connected to one another on the backside and then routed to front-side of the substrate using via structure to form terminal 1 (T1). In an example, terminal 3 (T3) is configured to a contact region accessible to the front-side of substrate. In an example, the node 1 (1) for each device elements R3 and R4 are configured to and connected on the front-side and form terminal 2 (T2). In an example, the device provides a shunt series shunt configuration. Additionally, the device includes use of three separate SCAR regions related to the devices, which form and make-up "Pi" configuration. In an example, as shown, is the shunt series shunt three element, three terminal "Pi" SCAR device 5200 having a single via on the R4 shunt leg plus a single via structure 1 connecting internal node two (2) for R2 and R3 to configured and make the T1 connection to the front-side of the substrate.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A monolithic filter ladder network comprising:
   a plurality of single crystal acoustic resonator devices, numbered from (R1) to (RN), where N is an integer greater than 1, configured on a common substrate member, each of the acoustic resonator device comprising:
   a bulk substrate structure, having a surface region, and a thickness of material, the bulk substrate structure having a first recessed region and a second recessed region, and a support member disposed between the first recessed region and the second recessed region, the bulk substrate structure being made of a material that is one of a gallium nitride (GaN), silicon carbide (SiC), silicon (Si), sapphire (Al2O3), aluminum nitride (AlN), or combinations thereof;

a thickness of single crystal piezo material formed overlying the surface region, the thickness of single crystal piezo material having an exposed backside region configured with the first recessed region and a contact region configured with the second recessed region, the single crystal piezo material having a thickness of greater than 0.4 microns, the single crystal piezo material being characterized by a dislocation density of less than $10^{12}$ defects/cm$^2$;

a first electrode member formed overlying an upper portion of the thickness of single crystal piezo material;

a second electrode member formed overlying a lower portion of the thickness of single crystal piezo material to sandwich the thickness of single crystal piezo material with the first electrode member and the second electrode member, the second electrode member extending from the lower portion that includes the exposed backside region to the contact region;

a second electrode structure electrically coupled to the second electrode member at the contact region;

a first electrode structure electrically coupled with the first electrode member;

a dielectric material overlying an upper surface region of a resulting structure overlying the bulk substrate member; and an acoustic reflector structure configured overlying the first electrode member, the upper portion, the lower portion, and the second electrode member.

2. The device of claim 1 wherein the support member is configured in a plane coincident with a bottom surface region of the bulk substrate structure.

3. The device of claim 1 wherein the support member is configured in a plane off-set and recessed in reference to a bottom surface region of the bulk substrate structure, but protruding in reference to the first and second recessed regions.

4. The device of claim 1 wherein the single crystal piezo material being characterized by X-ray diffraction with clear peak at a detector angle (2-Theta) associated with single crystal film and whose Full Width Half Maximum (FWHM) is measured to be less than 1.0°.

5. The device of claim 1 wherein N is equal to at least 7, and (R1), (R3), (R5), and (R7) are configured in a serial manner such that the second electrode structure of (R1) is coupled to the first electrode structure of (R3) and the second electrode structure of (R3) is coupled to the first electrode structure of (R5) and the second electrode structure of (R5) is coupled to the first electrode structure of (R7); and further comprising a first node configured between the second electrode structure of (R1) and the first electrode structure of (R3); a second node is configured between the second electrode structure of (R3) and the first electrode structure of (R5); and a third node is configured between the second electrode structure of (R5) and the first electrode structure of (R7).

6. The device of claim 1 wherein N is equal to at least 7, and (R1), (R3), (R5), and (R7) are configured in a serial manner such that the second electrode structure of (R1) is coupled to the first electrode structure of (R3) and the second electrode structure of (R3) is coupled to the first electrode structure of (R5) and the second electrode structure of (R5) is coupled to the first electrode structure of (R7); and further comprising a first node configured between the second electrode structure of (R1) and the first electrode structure of (R3); a second node is configured between the second electrode structure of (R3) and the first electrode structure of (R5); and a third node is configured between the second electrode structure of (R5) and the first electrode structure of (R7); and wherein (R2) is configured between the first node and a lower common electrode; (R4) is configured between the second node and the lower common electrode; and (R6) is configured between the third node and the lower common electrode.

7. The device of claim 1 wherein N is equal to at least 7 and (R1), (R3), (R5), and (R7) are configured in a serial manner such that the second electrode structure of R1 is coupled to the first electrode structure of (R3) and the second electrode structure of (R3) is coupled to the first electrode structure of (R5) and the second electrode structure of (R5) is coupled to the first electrode structure of (R7); and further comprising a first node configured between the second electrode structure of (R1) and the first electrode structure of (R3); a second node is configured between the second electrode structure of (R3) and the first electrode structure of (R5); and a third node is configured between the second electrode structure of (R5) and the first electrode structure of (R7); and wherein (R2) is configured between the first node and a lower common electrode such that the first electrode structure of (R2) is connected to the first node and the second electrode structure of (R2) is connected to the lower common electrode; (R4) is configured between the second node and the lower common electrode such that the first electrode structure is connected to the second node and the second electrode structure is connected to the lower common electrode; and (R6) is configured between the third node and the lower common electrode such that the first electrode structure of (R6) is connected to the third node and the second electrode structure of (R6) is connected to the lower common electrode.

8. The device of claim 1 wherein N is equal to at least 7 and (R1), (R2), and (R3) are configured to share a first common node; wherein (R3), (R4), and (R5) are configured to share a second common node; wherein (R5), (R6), and (R7) are configured to share a third common node; and wherein (R2), (R4), and (R6) are configured to share a fourth common node.

9. The device of claim 1 wherein at least one of the plurality of acoustic resonator devices including (R1), (R2), (R3), (R4), (R5), (R6), or (R7) comprises a via structure electrically coupled to the contact region.

10. The device of claim 1 wherein N is equal to at least 7 and (R1), (R2), and (R3) are configured to share a first common node; wherein (R3), (R4), and (R5) are configured to share a second common node; wherein (R5), (R6), and (R7) are configured to share a third common node; and wherein (R2), (R4), and (R6) are configured to share a fourth common node; and (R4) is configured with a via structure coupled to the fourth common node.

11. The device of claim 1 wherein the thickness of single crystal piezo material selected from at least one of AlN, AlGaN, InN, BN, or other group III nitrides.

12. The device of claim 1 wherein the thickness of single crystal piezo material is selected from at least one of a single crystal oxide including a high K dielectric, ZnO, or MgO.

13. The device of claim 1 wherein the each of the first electrode structure and the second electrode structure is selected from one of tantalum or molybdenum.

14. A configurable monolithic filter ladder network comprising:
a plurality of single crystal acoustic resonator (SCAR) devices, numbered from (R1) to (RN), where N is an integer greater than 1, configured on a common substrate member, each of the acoustic resonator device comprising:
a bulk substrate structure, having a surface region, and a thickness of material, the bulk substrate structure having a first recessed region and a second recessed region, the bulk substrate structure being made of a material that is one of a gallium nitride (GaN), silicon carbide (SiC), silicon (Si), sapphire (Al2O3), aluminum nitride (AlN), or combinations thereof, and a support member disposed between the first recessed region and the second recessed region;

a thickness of single crystal piezo material formed overlying the surface region, the thickness of single crystal piezo material having an exposed backside region configured with the first recessed region and a contact region configured with the second recessed region, the single crystal piezo material having a thickness of greater than 0.4 microns, the single crystal piezo material being characterized by a dislocation density of less than $10^{12}$ defects/cm$^2$;

a first electrode member formed overlying an upper portion of the thickness of single crystal piezo material;

a second electrode member formed overlying a lower portion of the thickness of single crystal piezo material to sandwich the thickness of single crystal piezo material with the first electrode member and the second electrode member, the second electrode member extending from the lower portion that includes the exposed backside region to the contact region; and a second electrode structure electrically coupled to the second electrode member at the contact region;

a first electrode structure electrically coupled with the first electrode member;

a dielectric material overlying an upper surface region of a resulting structure overlying the bulk substrate member.

15. The device of claim 14 wherein N is equal to at least 7; wherein (R1) and (R2) are configured to form a series shunt first two-element device; and (R6) and (R7) are configured to form a series shunt second two-element device.

16. The device of claim 14 wherein N is equal to at least 7; and wherein (R1), (R2), and (R3) are configured to make up a first series-shunt-series Y element SCAR device; and (R4), (R5) and (R6) are configured to make up a shunt-series-shunt three-element Pi SCAR device.

17. The device of claim 14 wherein the thickness of single crystal piezo material selected from at least one of AlN, AlGaN, InN, BN, or other group III nitrides.

18. The device of claim 14 wherein the thickness of single crystal piezo material is selected from at least one of a single crystal oxide including a high K dielectric, ZnO, or MgO.

19. The device of claim 14 wherein the each of the first electrode structure and the second electrode structure is selected from one of tantalum or molybdenum.

\* \* \* \* \*